United States Patent
Mayer et al.

(10) Patent No.: US 7,780,867 B1
(45) Date of Patent: *Aug. 24, 2010

(54) EDGE BEVEL REMOVAL OF COPPER FROM SILICON WAFERS

(75) Inventors: Steven T. Mayer, Lake Oswego, OR (US); Seshasayee Varadarajan, Wilsonville, OR (US); Douglas A. Preston, McMinnville, OR (US)

(73) Assignee: Novellus Systems, Inc., San Jose, CA (US)

( * ) Notice: Subject to any disclaimer, the term of this patent is extended or adjusted under 35 U.S.C. 154(b) by 771 days.

This patent is subject to a terminal disclaimer.

(21) Appl. No.: 11/248,874

(22) Filed: Oct. 11, 2005

Related U.S. Application Data

(60) Continuation-in-part of application No. 10/357,999, filed on Feb. 3, 2003, now Pat. No. 6,967,174, which is a division of application No. 09/558,249, filed on Apr. 25, 2000, now Pat. No. 6,537,416.

(60) Provisional application No. 60/157,254, filed on Oct. 1, 1999.

(51) Int. Cl.
C03C 15/00 (2006.01)

(52) U.S. Cl. .......................... 216/83; 216/13; 216/105; 216/106; 438/14; 438/17; 438/687; 438/676

(58) Field of Classification Search .................. 438/748, 438/745, 754, 706; 216/92, 105, 83, 223; 134/1.3; 205/223, 651, 668

See application file for complete search history.

(56) References Cited

U.S. PATENT DOCUMENTS 4,313,266 A * 2/1982 Tam ................................ 34/8
4,788,994 A * 12/1988 Shinbara .................... 134/157
4,968,375 A 11/1990 Sato et al.
5,009,738 A 4/1991 Gruenwald et al.
5,486,234 A 1/1996 Contolini et al.
5,532,190 A 7/1996 Goodyear et al.
5,674,410 A 10/1997 Nakajima et al.

(Continued)

FOREIGN PATENT DOCUMENTS

DE 4109955 * 10/1992

(Continued)

OTHER PUBLICATIONS

S.Wolf and R.N.Tauber, "Silicon Processing for the VLSI Era", vol. 1, Lattice Press 91986), pp. 516-520.*

(Continued)

*Primary Examiner*—Duy-Vu N Deo
*Assistant Examiner*—Maki A Angadi
(74) *Attorney, Agent, or Firm*—Weaver Austin Villeneuve & Sampson LLP

(57) ABSTRACT

Chemical etching methods and associated modules for performing the removal of metal from the edge bevel region of a semiconductor wafer are described. The methods and systems apply liquid etchant in a precise manner at the edge bevel region of the wafer, so that the etchant is applied on to the front edge, the side edge and the back edge. The etchant thus does not flow or splatter onto the active circuit region of the wafer. An edge bevel removal embodiment involving that is particularly effective at obviating streaking, narrowing the metal taper and allowing for subsequent chemical mechanical polishing, is disclosed.

59 Claims, 18 Drawing Sheets

U.S. PATENT DOCUMENTS

| | | | |
|---|---|---|---|
| 5,798,016 A | | 8/1998 | Oehrlein et al. |
| 5,810,940 A | | 9/1998 | Fukazawa et al. |
| 5,882,433 A | * | 3/1999 | Ueno .................. 134/31 |
| 5,897,379 A | | 4/1999 | Ulrich et al. |
| 6,046,097 A | | 4/2000 | Hsieh et al. |
| 6,114,254 A | * | 9/2000 | Rolfson .................. 438/758 |
| 6,162,739 A | | 12/2000 | Sumnitsch et al. |
| 6,167,893 B1 | * | 1/2001 | Taatjes et al. ............ 134/147 |
| 6,217,034 B1 | * | 4/2001 | Smedt et al. ............. 279/106 |
| 6,297,155 B1 | * | 10/2001 | Simpson et al. .......... 438/687 |
| 6,306,245 B1 | | 10/2001 | Yanagisawa et al. |
| 6,309,981 B1 | * | 10/2001 | Mayer et al. ............. 438/754 |
| 6,333,275 B1 | * | 12/2001 | Mayer et al. ............. 438/745 |
| 6,413,436 B1 | | 7/2002 | Aegerter et al. |
| 6,506,689 B2 | * | 1/2003 | Rolfson .................. 438/759 |
| 6,516,815 B1 | * | 2/2003 | Stevens et al. ........... 134/25.4 |
| 6,520,839 B1 | * | 2/2003 | Gonzalez-Martin et al. ... 451/41 |
| 6,537,416 B1 | * | 3/2003 | Mayer et al. .......... 156/345.17 |
| 6,578,853 B1 | | 6/2003 | Treur et al. |
| 6,586,342 B1 | * | 7/2003 | Mayer et al. ............. 438/754 |
| 6,589,878 B1 | * | 7/2003 | Lorimer .................. 438/704 |
| 6,967,174 B1 | * | 11/2005 | Mayer et al. ............. 438/748 |
| 7,029,567 B2 | * | 4/2006 | Basol .................... 205/223 |
| 2002/0179247 A1 | | 12/2002 | Davis et al. |

FOREIGN PATENT DOCUMENTS

| | | | |
|---|---|---|---|
| JP | 04-135110 | * | 5/1992 |
| JP | 04-186626 | * | 7/1992 |
| JP | 05-013322 | | 1/1993 |
| JP | 05-326483 | | 12/1993 |
| JP | 06-045302 | | 2/1994 |
| JP | 09-171989 | * | 6/1997 |
| WO | WO 99/46064 | | 9/1999 |

OTHER PUBLICATIONS

U.S. Office Action mailed Aug. 27, 2001, from U.S. Appl. No. 09/557,695.

U.S. Office Action mailed Dec. 16, 2004, from U.S. Appl. No. 10/357,999.

U.S. Office Action mailed on Mar. 30, 2001 from U.S. Appl. No. 09/557,668 now U.S. Patent No. 6,309,981.

U.S. Office Action mailed on Jun. 19, 2002 from U.S. Appl. No. 09/558,249 now U.S. Patent No. 6,537,416.

U.S. Appl. No. 11/479,353, Mountsier et al., "Methods for removing deposits from the edge of a silicon substrate using plasma discharge", filed Jun. 30, 2006.

U.S. Appl. No. 11/515,346, Henri et al., "Edge removal of films using externally generated plasma species", filed Aug. 31, 2006.

U.S. Appl. No. 11/737,045, Stephens et al., "Wafer chuck with aerodynamic design for turbulence reduction", filed Apr. 18, 2007.

U.S. Appl. No. 12/199,412, Ganesan et al., "Apparatus and method for edge bevel removal of copper from silicon wafers", filed Aug. 27, 2008.

U.S. Appl. No. 12/394,339, Feng et al., "Magnetically actuated chuck for edge bevel removal", filed Feb. 27, 2009.

U.S. Appl. No. 11/479,353, Office Action mailed Dec. 2, 2008.

Glen Research Center, "Shape Effects on Drag", National Aeronautics and Space Administration website http://www.grc.nasa.gov/WWW/K/airplane/shaped.html downloaded Apr. 18, 2007.

U.S. Appl. No. 11/515,346, Office Action mailed May 6, 2009.

U.S. Appl. No. 11/479,353, Office Action mailed Jun. 1, 2009.

U.S. Appl. No. 11/515,346, Office Action mailed Nov. 12, 2009.

U.S. Appl. No. 11/479,353, Office Action mailed Dec. 7, 2009.

\* cited by examiner

EDGE BEVEL REMOVAL OF COPPER FROM SILICON WAFERS

CROSS-REFERENCE TO RELATED APPLICATIONS

This application claims priority as a continuation-in-part application under 35 U.S.C. §120 from U.S. patent application Ser. No. 10/357,999, filed Feb. 3, 2003 now U.S. Pat. No. 6,967,174, naming S. Mayer et al. as inventors, and titled "WAFER CHUCK FOR USE IN EDGE BEVEL REMOVAL OF COPPER FROM SILICON WAFERS," which is a divisional application of U.S. patent application Ser. No. 09/558,249, filed Apr. 25, 2000, naming Mayer et al. as inventors, and titled "WAFER CHUCK FOR USE IN EDGE BEVEL REMOVAL OF COPPER FROM SILICON WAFERS" (now U.S. Pat. No. 6,537,416), which in turn claims benefit under 35 U.S.C. §119(e) of U.S. Provisional Application No. 60/157,254, filed Oct. 1, 1999, naming S. Mayer et al. as inventors, and titled "METHOD, MATERIALS AND APPARATUS FOR EDGE BEVEL REMOVAL OF COPPER FROM SILICON WAFERS." This patent application is also related to the following U.S. Patent Applications: U.S. patent application Ser. No. 09/557,668, filed Apr. 25, 2000 (now U.S. Pat. No. 6,309,981); U.S. patent application Ser. No. 09/954,728, filed Sep. 12, 2001 (now U.S. Pat. No. 6,586,342); and U.S. patent application Ser. No. 09/557,695, filed Apr. 25, 2000 (now U.S. Pat. No. 6,333,275). These patent applications, as well as any patents, patent applications and publication referenced elsewhere herein are hereby incorporated by reference in their entireties and for all purposes.

BACKGROUND

This invention relates to technology for removing unwanted metal from semiconductor wafers. More particularly, it pertains to methods for removing unwanted metal, particularly metal in the edge bevel region, using liquid etchants, as well as apparatus modules for performing such removal.

Damascene processing is a method for forming metal lines on integrated circuits. It is often a preferred method because it requires fewer processing steps than other methods and offers a higher yield. In Damascene processing, as well as other integrated circuit manufacturing processes, the conductive routes on the surface of the circuit are generally formed out of a common metal, traditionally aluminum. Copper is now a favored metal because of its higher conductivity and electromigration resistance when compared to aluminum, but copper presents special challenges because it readily diffuses into silicon oxide and reduces its electrical resistance at very low doping levels. During integrated circuit fabrication, the conductive metal is needed on the active circuit region of the wafer, i.e., the main interior region on the front side, but is undesirable elsewhere.

In a typical copper Damascene process, the formation of the desired conductive routes generally begins with a thin physical vapor deposition (PVD) of seed metal, followed by a thicker electrofill layer (which is formed by electroplating). The PVD process is typically sputtering. In order to maximize the size of the useable wafer area (sometimes referred to herein as the "active surface region") and thereby maximize the number of integrated circuits produced per wafer), the electrofilled metal must be deposited to very near the edge of the semiconductor wafer. Thus, it is necessary to allow physical vapor deposition of the metal over the entire front side of the wafer. As a byproduct of this process step, PVD metal typically coats the front edge area outside the active circuit region, as well as the side edge, and to some degree, the backside.

Electrofill of the metal is much easier to control, since the electroplating apparatus can be designed to exclude the electroplating solution from undesired areas such as the edge and backside of the wafer. One example of plating apparatus that constrains electroplating solution to the wafer active surface is the SABRE™ clamshell electroplating apparatus available from Novellus Systems, Inc. of San Jose, Calif. and described in U.S. Pat. No. 6,156,167 "CLAMSHELL APPARATUS FOR ELECTROCHEMICALLY TREATING SEMICONDUCTOR WAFERS," by E. Patton et al., and filed Nov. 13, 1997, which is herein incorporated by reference in its entirety. However, even with such advanced apparatus, small amounts of copper can be deposited on the edge regions of the wafer. Also, it is sometime desirable to remove material that was previously within (at smaller radii) the clamshell plating-exclusion region because the transition region may contain defects (e.g. particles, unplated areas, etc), or have a rapidly changing thickness profile, both of which may complicate subsequent copper planarization and/or removal operations for the wafer as a whole (e.g., CMP, ECMP (electrochemical mechanical polishing), MMEP (membrane mediated electropolishing), etc.).

The PVD metal remaining on the wafer edge after electrofill is undesirable for various reasons. One reason is that PVD metal layers left at the edge after CMP are not suitable for subsequent layer metal deposition on top of them (e.g. subsequent dielectric layer will not adhere well to the PVD copper base layer if it is not removed). Also, the PVD layers are thin and tend to flake off during subsequent handling, thus generating undesirable particles. This can be understood as follows. At the front side edge of the wafer, the wafer surface is beveled. Here the PVD layers are not only thin, but also unevenly deposited. Thus, they do not adhere well. Adhesion of subsequent dielectric layers onto such thin metal is also poor, thus introducing the possibility of even more particle generation. By contrast the PVD metal on the active interior region of the wafer is simply covered with thick and evenly deposited electrofill metal, which can be planarized by CMP down to the dielectric. This flat surface, which is mostly dielectric, is then covered with a barrier layer substance such as SiN, that both adheres well to the dielectric and aids in the adhesion of subsequent layers. Another reason to remove the residual PVD metal layers in the wafer edge area is that the barrier layers underneath them are also thin and uneven, which may allow migration of the metal into the dielectric. This problem is especially important when the metal is copper.

To address these problems, semiconductor equipment may have to allow etching of the unwanted residual metal layers. Various difficulties will be encountered in designing a suitable etching system.

One of the main difficulties involves the precise application of the etchant to the edge bevel region without allowing it to contact the active circuit region of the wafer. Physical shielding of the active circuit region is an option, but it is undesirable because contacting the wafer in this manner causes particle generation from the surface of the wafer. In addition, it is highly desirable to apply the etchant in a very narrow, confined region at the outer boundary of the wafer, so that the interior active circuit region is defined as expansively as possible. Other difficulties in designing an etching method and system include precise alignment of the wafer on the wafer chuck for rotation, proper pre-wetting, rinsing and drying procedures, and adequate clamping of the wafer in situations where undesired movement is possible. Since backside etching of the wafer is often necessary and desirable at the time of edge bevel removal (EBR), an invention addressing these needs should also be able to perform the back side etch.

Additional problems include the fact that etchant may splash back from the walls of the EBR module, thus causing unwanted oxidation ("streaking") on the wafer surface. Nozzle orifices for dispensing the etchant are difficult to manufacture to precise desired diameters, and any variance in this diameter can result in significantly varying exit velocities from the nozzle. The taper from the region of metalization to the region without metal may also be quite wide, which is undesirable for purposes with respect to subsequent copper removal/planarization steps (e.g. CMP, electropolishing, electroetching).

SUMMARY

The present invention provides chemical etching methods and associated modules for performing the removal of metal from the edge bevel region of a semiconductor wafer, which includes the front side edge, the side edge and the back side. The invention provides methods and systems for applying the etchant in a precise manner at the edge bevel region of the wafer so that the etchant may be applied on to the front edge area as well as the side edge and the back edge. Preferably, the etchant thus does not flow or splatter onto the active circuit region of the wafer.

One aspect of the invention pertains to methods of removing unwanted metal deposited on an edge bevel area of a semiconductor wafer. The method may be characterized by the following operations: (a) rotating the wafer; and (b) delivering a liquid etchant onto the edge of the rotating wafer such that the liquid etchant selectively wets the edge bevel area and substantially removes unwanted metal selectively from the edge bevel area. In certain embodiments, the liquid etchant flows over the edge bevel area for at least a portion of time during which the metal is removed from the edge bevel area. For example, the flow of liquid etchant may be continuous throughout the time during which the metal is removed from the edge bevel area. In other embodiments, the flow of liquid etchant is suspended during at least a portion of time during which metal is removed from the edge bevel region. Thereafter the etchant may be rinsed from the edge bevel area. In certain embodiments, the flow of liquid etchant is suspended for between about 1 and 60 seconds (e.g., about 2 and 30 seconds). During the time when the flow of etchant is suspended, the liquid etchant may remain on the wafer for a period of time after application of the liquid etchant. In a specific embodiment, liquid etchant remains on the wafer for between about 1 and 60 seconds (e.g., about 2 and 30).

Another aspect of the invention pertains to post-electrofill modules including components for removing unwanted metal deposited on an edge bevel area of a semiconductor wafer. Such modules may be characterized by the following features: (a) a rotatable chuck; and (b) a liquid etchant delivery system including a nozzle which delivers liquid etchant onto the edge of the wafer while it rotates in the chuck, such that the liquid etchant selectively wets the edge bevel area. Such modules are intended to be operated such that the liquid etchant substantially removes unwanted metal selectively from the edge bevel area.

Still another aspect of the invention pertains to integrated modules including components for electrofilling metal onto a semiconductor wafer and removing unwanted metal deposited on an edge bevel area from the semiconductor wafer. Such modules may be characterized by the following features: (a) a component for electrofilling metal onto the semiconductor wafer; (b) a rotatable chuck; and (c) a liquid etchant delivery system including a nozzle which delivers liquid etchant onto the edge of the wafer while it rotates in the chuck, such that the liquid etchant selectively wets the edge bevel area. Such modules may be operated such that the liquid etchant substantially removes unwanted metal selectively from the edge bevel area.

In the above described methods and apparatus, the metal to be etched is typically deposited copper. The invention may allow selective removal of metal at a rate of at least 400 Å per second. Further, the method provides for a liquid etchant delivered onto the edge of the rotating wafer without substantially contacting any region of the wafer inside of the edge bevel area. In a specific embodiment, the nozzle may be positioned so that delivery of the liquid etchant has an angular component in the direction of rotation of the wafer edge (in the direction of the wafer tangent) of about 45 degrees. The nozzle may also be positioned so that delivery of the liquid etchant has a radial component away from the center of the wafer and toward the edge of the wafer of about 25-35 degrees. The wafer may be rotated at about 150-400 rpm, for example about 225 or 350 rpm. A parametric result is the taper width. The taper width is defined as the distance over which the thickness varies from nominally the same as in the more central locations of the wafer to no metal in the edge bevel removed regions. Preferably, the method reduces the taper width of the metal at the edge of the wafer to less than about 300 μm.

In certain embodiments, components of the liquid etchant are mixed to form the liquid etchant, and the mixing takes place in delivery lines provided to deliver the liquid etchant from sources of the components to the rotating wafer. Heat generated by mixing or chemical reaction may be used to raise the temperature of the liquid etchant as delivered onto the edge of the rotating wafer. In a specific embodiment, the temperature of delivered liquid etchant is at least about 40° C., or at least about 80° C. Suitable components for heated etchant deliver may be sulfuric acid and hydrogen peroxide. In a specific embodiment, the sulfuric acid component is provided in concentration of at least about 40% by weight, or at least about 80% by weight. In certain embodiments, the sulfuric acid and hydrogen peroxide are provided in volume ratios of between about 30:70 and 70:30 for sulfuric acid and hydrogen peroxide.

These and other features and advantages of the present invention will be described in more detail below with reference to the associated drawings.

DETAILED DESCRIPTION

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention.

As indicated, this invention pertains to removal of unwanted copper metal from an edge bevel region of a semiconductor wafer. A "semiconductor wafer" as referred to in this invention is a semiconductor substrate at any of the various states of manufacture in the production of integrated circuits. One standard semiconductor wafer described in this invention is 200 mm in diameter, 0.75 mm thick, with an approximate radius of curvature of about 0.15 millimeters (see SEMI Specification M1-0298). Of course, semiconductor wafers of other dimensions, such as a standard 300 mm diameter silicon wafers, can also be processed in accordance with this invention. Note that standard specifications for a 300 mm diameter wafer may be found in SEMI Specification M1.15-0997.

Figure 1A:
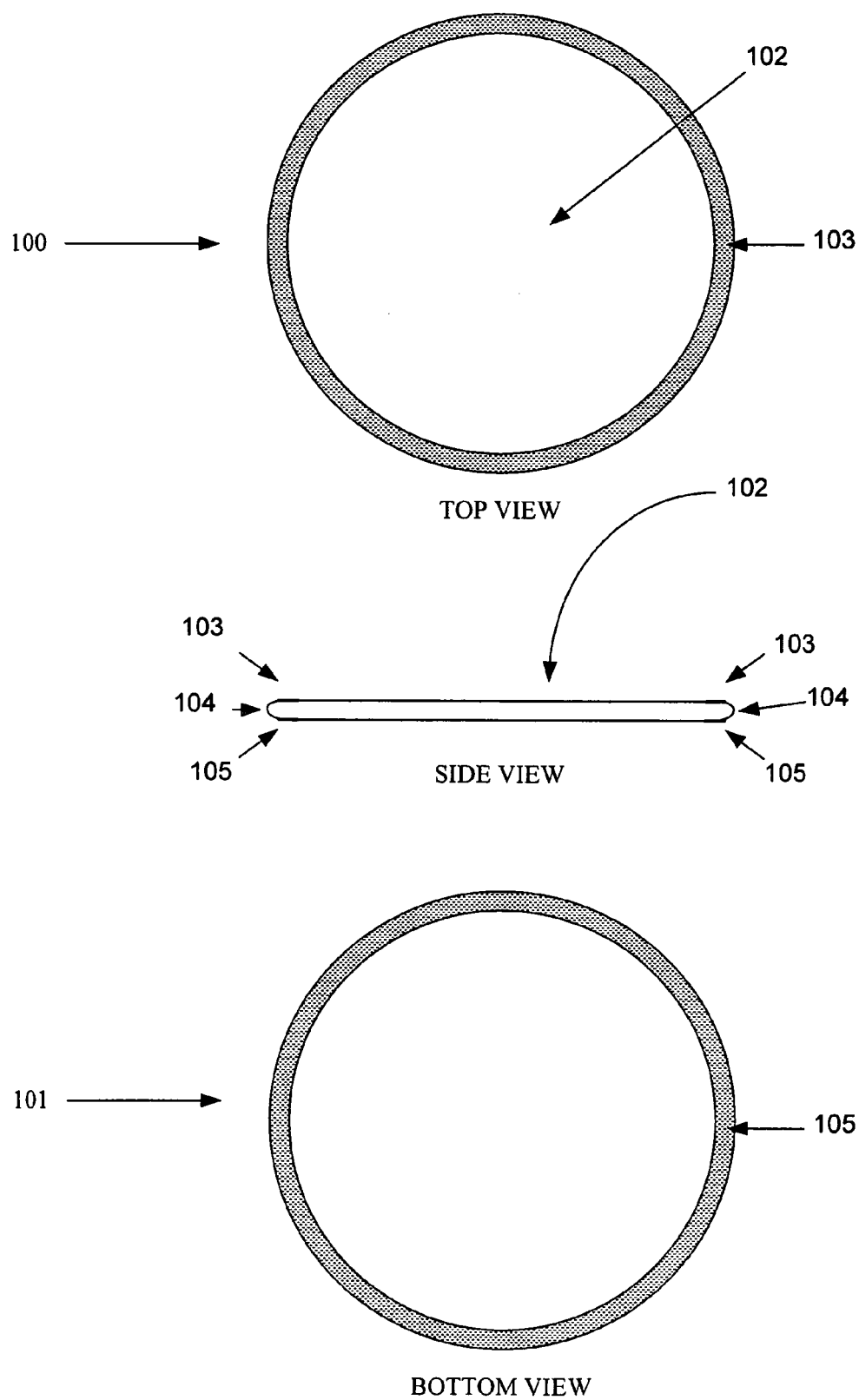
FIG. 1A is an illustration of a semiconductor wafer showing the location of the edge bevel region that is etched in accordance with this invention.

To facilitate understanding the concepts of this invention, a schematic illustration of a semiconductor wafer is shown in FIG. 1A. As shown, such semiconductor wafer has a top or "front" side 100 and a "backside" 101. The wafer also has an interior "active circuit region" 102 where integrated circuit devices with associated conductive metal routes are formed. To make maximum use of expensive semiconductor material, this active circuit region should constitute a high fraction of the area on the front side 100 of the wafer. With a 200 mm wafer, the present invention allows the interior active surface region to extend the useable active region to within at least 1.5 and 4 mm of the outer boundary of the wafer. As shown, integrated circuit wafers also include a "front edge" area 103, which is the region on the front of the wafer that lies outside the active circuit region, a "side edge" area 104 (sometimes referred to herein as an "edge bevel region") and a "back edge" area 105. The side edge lies in the area between the front side and the backside, and the back edge is roughly the area near the outer boundary of the wafer on its backside, approximately analogous to the front edge area. Unwanted metal such as copper may deposit on regions 103, 104, and 105. Some metal may also deposit over the entire backside 101. One use of the present invention is to remove unwanted metal from these regions without substantially affecting metal deposited on active region 102.

A "post-electrofill module" (PEM) or "EBR module" as referred to in this invention is a module that is specifically designed to carry out the edge bevel removal (EBR) process, as well as a backside etch (BSE) process, in most cases. It may also perform processes ancillary to the EBR, including pre-rinsing, rinsing, acid washing, applying other chemicals to the general surface by spraying, and drying. An integrated-electrofill module as referred to in this invention is a module that carries out electrofill.

Figure 1B:
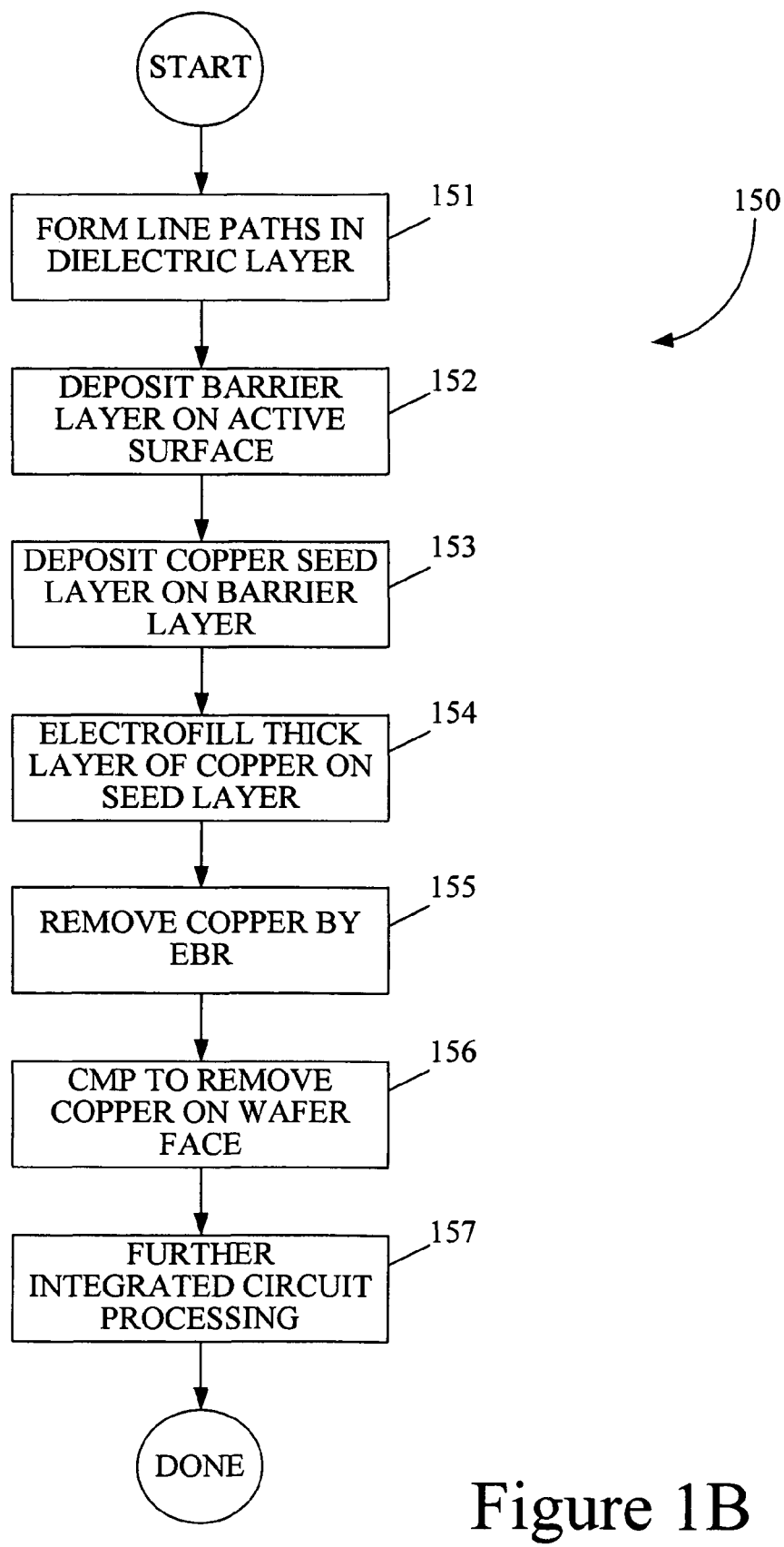
FIG. 1B is a process flow diagram illustrating relevant operations employed to form conductive copper lines a Damascene process in the context of this invention.

While details of the preferred embodiment may be found below in this application, a short description of a typical Damascene process will now be provided to facilitate understanding the context of the present invention. A typical Damascene process flow 150 is illustrated in the flowchart of FIG. 1B. Process 150 begins with formation of line paths 151 in a previously formed dielectric layer. These line paths may be etched as trenches and vias in a blanket layer of dielectric such as silicon dioxide. They define conductive routes between various devices on a semiconductor wafer. Because copper or other mobile conductive material provides the conductive paths of the semiconductor wafer, the underlying silicon devices must be protected from metal ions (e.g., copper) that might otherwise diffuse into the silicon. To accomplish this, the process includes depositing a thin diffusion barrier layer 152 before depositing the metal. Suitable materials for the diffusion barrier layer include tantalum, tantalum nitride, tungsten, titanium, and titanium tungsten. In a typical embodiment, the barrier layer is formed by a PVD process such as sputtering or by an atomic layer deposition process.

The wafer is now nearly ready to have its line paths inlayed with the electrofill copper. However, before electrofilling, a conductive surface coating must be applied. In the depicted process, this is accomplished by depositing a copper seed layer on the barrier layer at 153. A PVD process such as sputtering may be employed to this end. Alternatively, or in addition, seed layer metal may be deposited by an electrolytic or electroless process. The wafer is then electrofilled at 154 with a thicker layer of copper over the seed layer, by electroplating using an electroplating solution. The copper is deposited to a thickness that completely fills the various line paths in the dielectric layer. Due to such things as seal leakage, it is possible that some small quantities of copper may be deposited on edge bevel regions during the electroplating process, despite the presence of a clamshell at the periphery.

As mentioned, it is desirable to use as much of the wafer surface for active circuitry as possible. While it is generally a straightforward matter to shield unwanted areas from an electroplating solution, the same kind of shielding cannot be so easily and precisely done with PVD. Thus deposition of PVD copper in some unwanted areas cannot be avoided. This copper must be removed, and this is accomplished by the edge bevel removal (EBR) and/or backside etch BSE processes of the present invention.

With EBR at 155, a copper etchant is applied to the front edge of the wafer in a thin stream. The etchant is preferably applied under viscous flow conditions so that it remains in a thin, viscous layer near the point on the wafer where it is applied, and thus avoids splashing the interior of the wafer. Because the etchant is also generally applied with a radial velocity component, and because of the centripetal acceleration effects of the rotating wafer, the thin viscous layer flows outward, down over the side edge and a few millimeters onto the backside, thus accomplishing removal of the PVD copper from all three of these areas. In certain embodiments, the etchant is applied by other modes of delivery such as spraying, partial immersion, or wiping or brushing with a wetted sponge or brush the edge region to apply etchant with a mechanism containing limited amounts of etchant. In some embodiments, the etchant resides stationary or somewhat stationary on the edge area(s) for a period of time while metal removal occurs and after application (by, for example, flowing, wiping or brushing) of etchant has ceased. More specifics of the EBR process are described below.

After EBR, the electroplated copper is typically planarized, generally by chemical-mechanical polishing (CMP) (or an electrolytic process such as electropolishing, membrane mediated electroplanarization, electrochemical mechanical polishing, etc.) down to the barrier layer and/or the dielectric at 156 in preparation for further processing (illustrated at 157), generally the addition of subsequent dielectric and metalization layers.

Figure 1C:
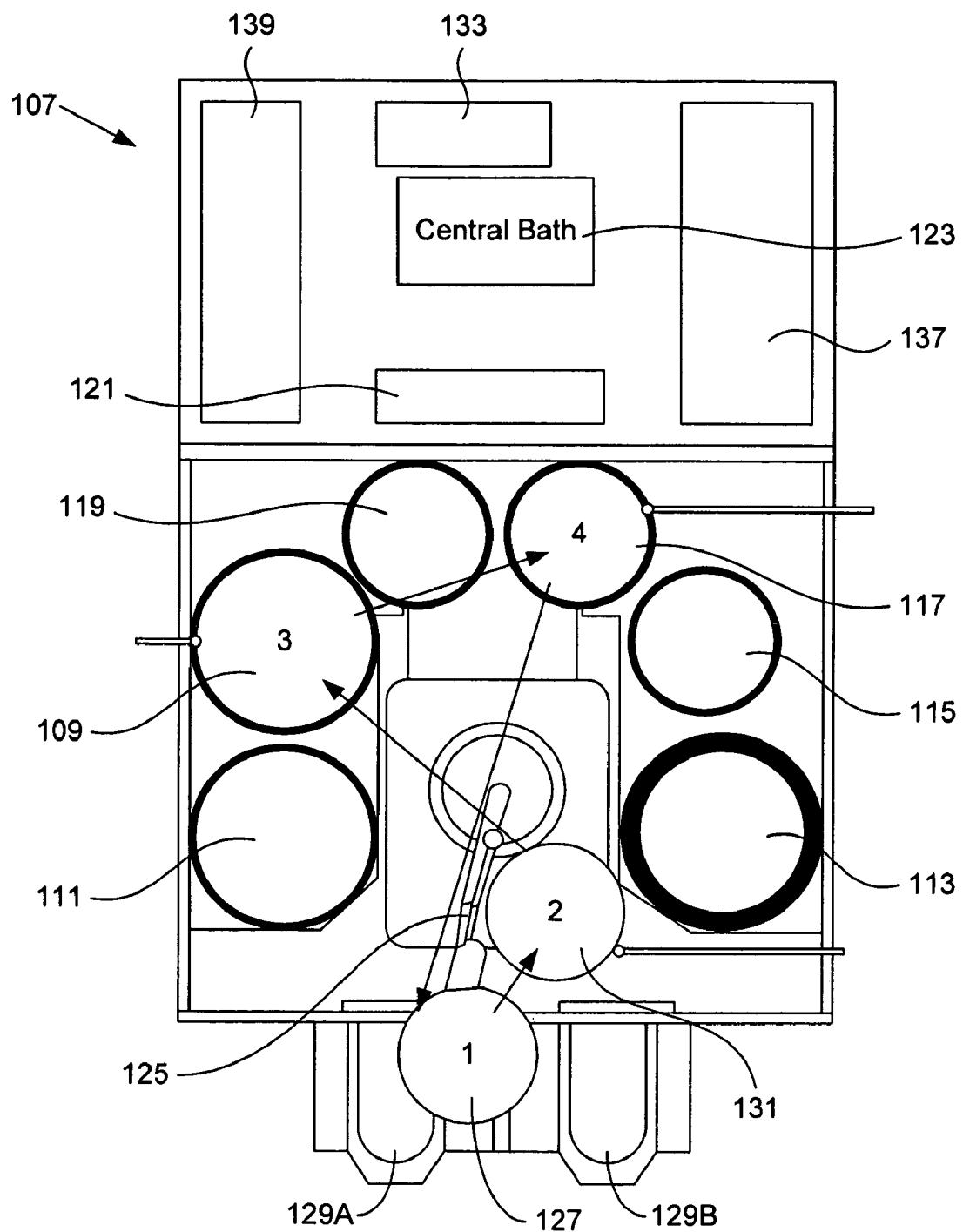
FIG. 1C is a block diagram illustrating a group of modules used to form copper conductive lines on an integrated circuit.

FIG. 1C depicts an electrofill system 107 in which the invention may reside. The specific system includes three separate electrofill modules 109, 111 and 113. System 107 also includes three separate post electrofill modules 115, 117 and 119. Each of these may be employed to perform each of the following functions: edge bevel removal, backside etching, and acid cleaning of wafers after they have been electrofilled by one of modules 109, 111, and 113. System 107 also includes a chemical dilution module 121 and a central electrofill bath 123. This is a tank that holds the chemical solution used as the electroplating bath in the electrofill modules. System 107 also includes a dosing system 133 that stores and delivers chemical additives for the plating bath. A chemical dilution module 135 stores and mixes chemicals to be used as the etchant in the post electrofill modules. A filtration and pumping unit 137 filters the plating solution for central bath 123 and pumps it to the electrofill modules. Finally, an electronics unit 139 provides the electronic and interface controls required to operate system 107. Unit 139 may also provide a power supply for the system.

In operation, a robot including a robot arm 125 selects wafers such as a wafer 127 from a wafer cassette such as a cassette 129A or a cassette 129B. Robot arm 125 may attach to wafer 127 using a vacuum attachment.

To ensure that wafer 127 is properly aligned on robot arm 125 for precision delivery to an electrofill module, robot arm 125 transports wafer 127 to an aligner 131. In a preferred embodiment, aligner 131 includes alignment arms against which robot arm 125 pushes wafer 127. When wafer 127 is properly aligned against the alignment arms, the robot arm 125 moves to a preset position with respect to the alignment arms. It then reattaches to wafer 127 and delivers it to one of the electrofill modules such as electrofill module 109. There, wafer 127 is electrofilled with copper metal. Electrofill module 109 employs electrolyte from a central bath 123.

After the electrofill operation completes, robot arm 125 removes wafer 127 from electrofill module 109 and transports it to one of the post-electrofill modules such as module 117. There unwanted copper from certain locations on the wafer (namely the edge bevel region and the backside) is etched away by an etchant solution provided by chemical dilution module 121.

Preferably wafer 127 is precisely aligned within post electrofill module 117 without making use of aligner 131. To this end, the post electrofill modules may be provided with an alignment chuck as referenced elsewhere herein. In alternative embodiment, wafer 127 is separately aligned within aligner 131 after electrofill and prior to edge bevel removal in module 117.

After processing in post electrofill module 117 is complete, robot arm 125 retrieves wafer 127 from the module and returns it to cassette 129A. From there the cassettes can be provided to other systems such as a chemical mechanical polishing system for further processing.

Figure 2A:
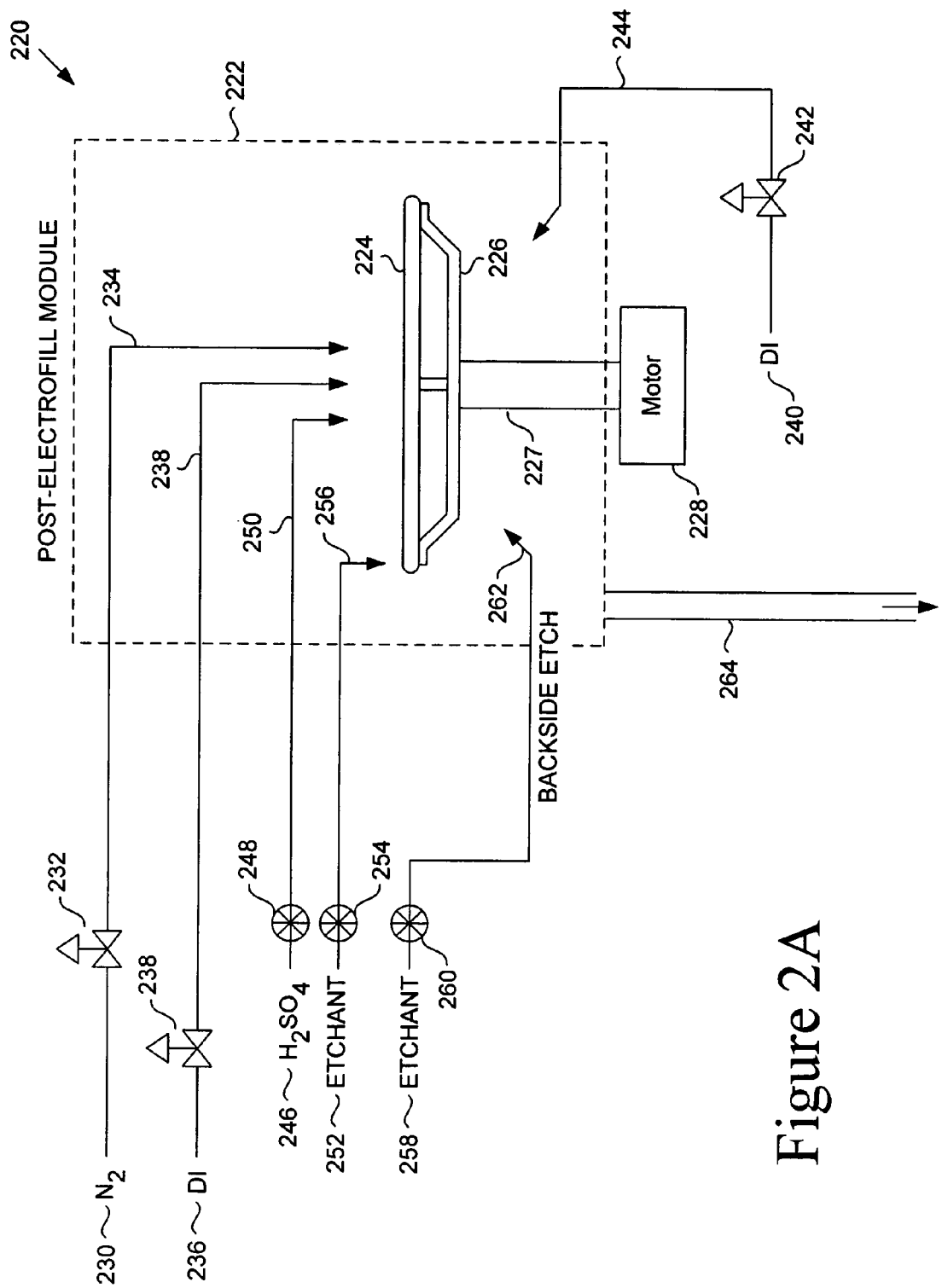
FIG. 2A is a block diagram illustrating various elements of a post-electrofill module in accordance with one embodiment of this invention.
Figure 2B:
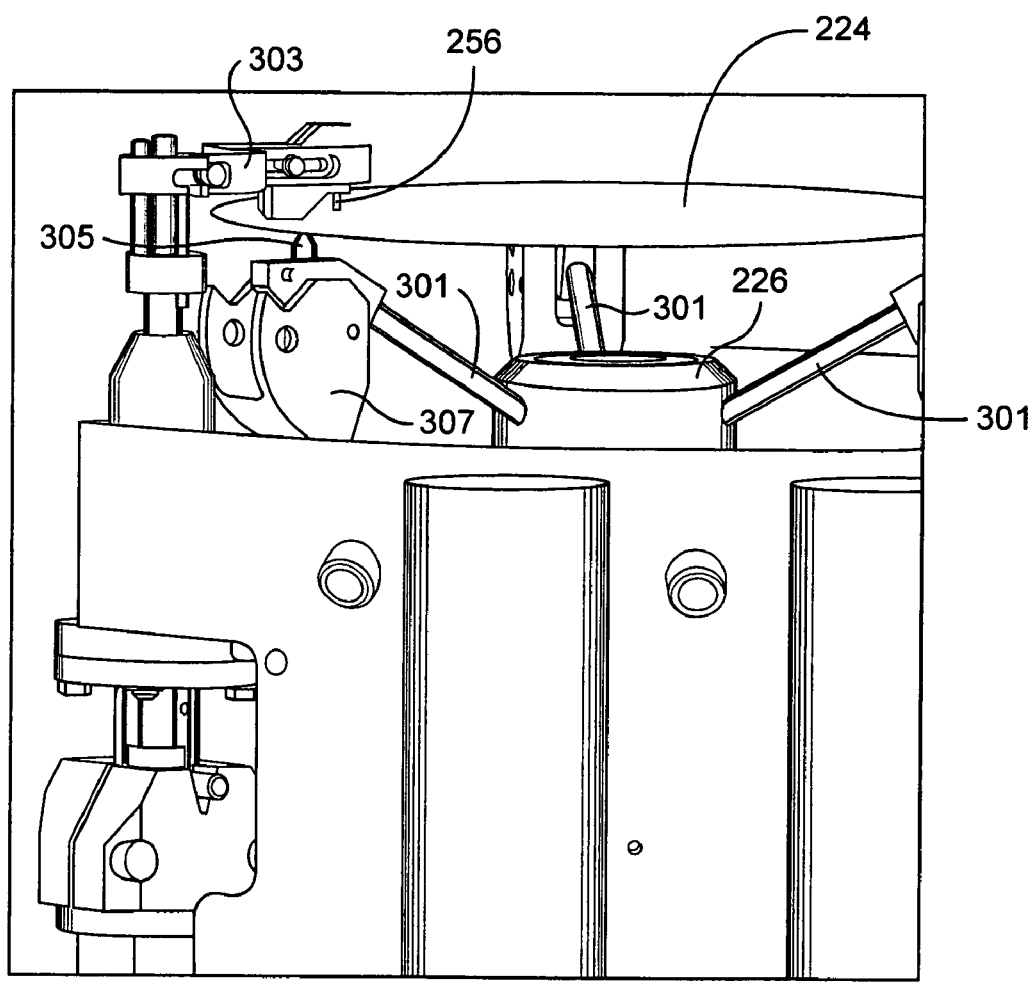
FIG. 2B is a perspective view of a post-electrofill module.

FIG. 2A schematically illustrates one preferred post-electrofill module 220 suitable for use with this invention. FIG. 2B presents such module in a perspective view. As shown, module 220 includes a chamber 222 in which a semiconductor wafer 224 rotates. Wafer 224 resides on a wafer chuck 226 which imparts rotational motion to wafer 224. Chamber 222 is outfitted with a drain and associated drain line 264. The drain allows the various liquid streams provided to chamber 222 to be removed for waste treatment.

A motor 228 controls the rotation of chuck 226. Motor 228 should be easy to control and should smoothly transition between various rotational speeds. It may reside within or without chamber 222. In some embodiments, to protect against damage from liquid etchant, motor 228 resides outside of chamber 222 and is separated therefrom by a seal through which a rotating shaft 227 passes. Any wobble in the shaft on rotation should be small (~<0.05 millimeters for example) so that the location of fluid nozzles with respect to the wafer does not vary substantially, nor shake the wafer from its center while it is not confined by alignment or clamping members. Preferably, motor 228 can rapidly accelerate and decelerate (in a controlled fashion) chuck 226 and wafer 225 at rotation rates between 0 and about 2000 rpm. The motor speed and other operations should be controllable by a computer.

Chuck 226 may be of any suitable design that holds wafer 224 in position during various rotational speeds. It may also facilitate alignment of wafer 224 for the etching process. A few particularly preferred examples of wafer chucks are described in U.S. Pat. No. 6,537,416, previously incorporated by reference.

Chamber 222 may be of any suitable design that confines the liquid etchant within its interior and allows delivery of the various fluids to wafer 224. It should be constructed of an etchant resistant material and include ports and nozzles for the various liquid and gaseous streams used during etching and cleaning.

Gaseous nitrogen is provided to post electrofill module 220 from a source of nitrogen 230. Preferably, this is a central source of nitrogen available to various processes throughout an integrated circuit manufacturing facility. Nitrogen from source 230 is delivered to chamber 222 under the control of a valve 232. The gaseous nitrogen is delivered into chamber 222 via a line and nozzle 234 positioned to deliver the nitrogen directly onto wafer 224, preferably at the center of the wafer. This enables blowing dry, particle-free nitrogen at the center, upper face of the wafer. This orientation of the nozzle increases the drying rate at the wafer center, where the centrifugal forces are small. Other suitable gas drying sub-systems may be employed as will be appreciated by those of skill in the art. For example, drying gases other than nitrogen may be employed in some embodiments. Also, the orientation and blowing direction of the nitrogen nozzle may be widely varied.

The next input of interest to module 220 is a source of deionized water 236. As with the source of nitrogen 230, the source of deionized water 236 preferably originates with a central source within an integrated circuit fabrication facility. The deionized water is delivered to chamber 222 under the control of a valve 238 and through a delivery line and nozzle 238. Note that line 238 directs deionized water onto the top of wafer 224. This enables rinsing of the wafer's top side. A preferred nozzle with an internal diameter of between ⅛" and ¼" diameter delivers a stream of fluid directed at the center of a wafer. The nozzle height above the wafer surface being between 1 to 2 inches. Alternatively a nozzle sprays fluid as a thin "fan" that spreads out over the inner three-quarters of the wafer diameter. Preferably, the thickness of the fan is no more than about one-fifth of the wafer diameter. The spray can impact the wafer with a velocity in the same direction as the wafer is rotating, or opposite the direction of rotation, or even in both directions if the spray fan crosses the wafer center. Preferably, the spray is directed opposite to the direction of rotation to increase convective mixing.

A similar deionized water system provides a stream or fan of deionized water to the backside of wafer 224. This deionized water is provided from a source of deionized water 240, which may be the same as source 236. A valve 242 controls the flow of deionized water onto the backside of wafer 224 via a line and nozzle 244. The nozzle associated with 244 may have the same design criteria as just mentioned for nozzle 238. The goal is to rinse etchant from the backside of wafer 224.

In a preferred embodiment, an acid rinse is conducted on the front side of wafer 224. To this end, a source of sulfuric acid 246 provides sulfuric acid to a delivery line and nozzle 250. Other acids may be used as appropriate. Preferably, the source 246 of sulfuric acid is a chemical dilution module described in U.S. Pat. No. 6,333,275 issued Dec. 25, 2001, which is incorporated herein by reference for all purposes. Alternatively, an etchant can be used to remove some of the metal from the surface (and not just at the wafer's edge). In certain embodiments, the etchant removes about 50-100 Angstroms of metal from the surface. Examples of suitable etchant comprise mixtures of oxidizers and complexing agents, as described in copending U.S. patent application Ser. No. 10/690,084 filed Oct. 20, 2003 by Koos et al., which is incorporated herein by reference for all purposes. Note that the etchant treatment is also well suited to be applied prior to the EBR process with the objective of removing unwanted surface-adherent organic compounds that were left as a result of an earlier plating (electrofill) step. Preferably, the EBR module includes a valve that controls the delivery of sulfuric acid and/or etchant to module 220. The flow of sulfuric acid into chamber 222 may be monitored by a mass flow meter 248. Note that in the depicted embodiment nozzle 250 is oriented to direct sulfuric acid or etchant substantially onto the center of the front side of wafer 224. After the acid or etchant is delivered to the center of the wafer it then spins out into the edge of the wafer during rotation. The acid solution is applied to remove residual copper oxide which remains after oxidizing (etching) the wafer (both by EBR and on the wafer as a whole) and aids in the overall cleaning of the wafer. Only a relatively small amount of acid is typically required (e.g., 0.5 to 2 milliliters/200 mm wafer). After its application, the wafer's front side is rinsed with deionized water through nozzle 238.

Liquid etchant used to remove copper or other unwanted metal from portions of wafer 224 is provided from a source of liquid etchant 252 as shown. Preferably, this source is provided by the above-mentioned chemical dilution module. The etchant passes through a mass flow meter 254 and is delivered to wafer 224 via a line and nozzle 256. Preferably, the etchant is delivered to the edge bevel region of wafer 224 to remove PVD metal, electroplated, electrolessly plated, or any other source of unwanted metal in that region. In certain embodiments, the metal to be removed is copper.

A second liquid etchant stream may be delivered to the backside of wafer 224 in order to etch off any copper or other unwanted metal that may have been deposited on the backside of wafer 224. As shown, such etchant is delivered from an etchant source 258. Preferably, this is the same source as 252. In other words, the chemical dilution module provides etchant for both edge bevel removal and backside etch. As shown, etchant from source 258 passes through a mass flow meter 260 and through a nozzle 262, which directs it onto the backside of wafer 224.

Figure 2C:
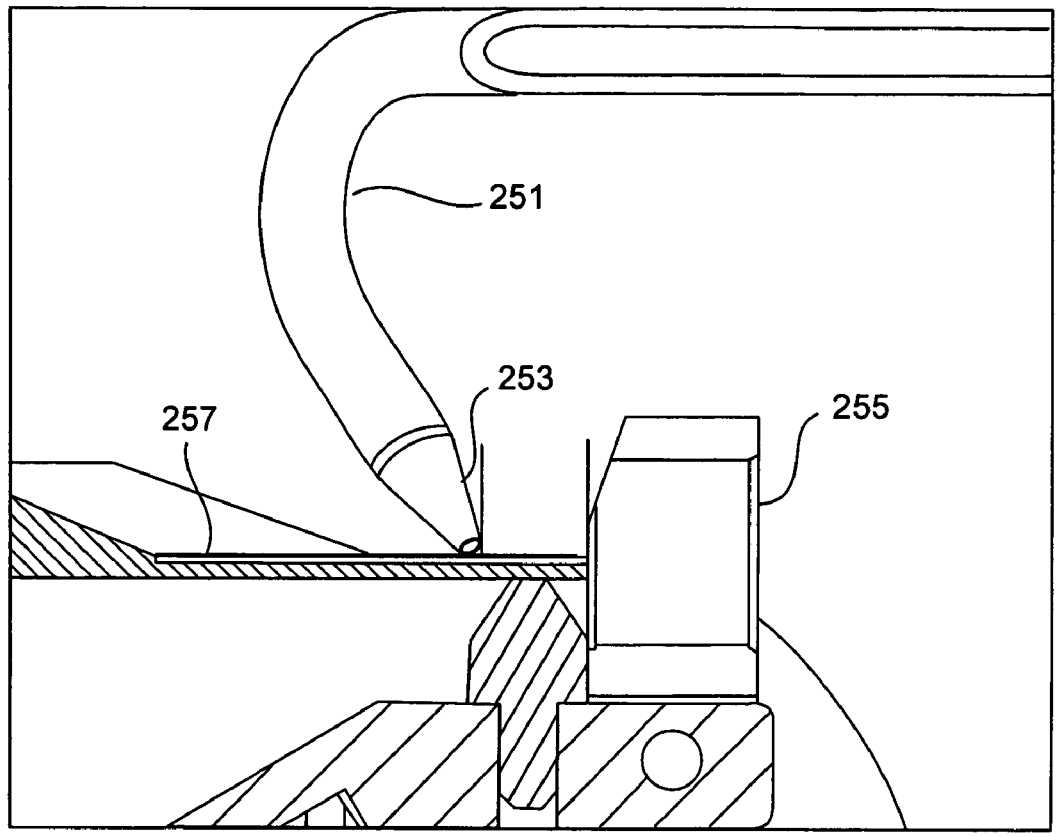
FIG. 2C is a side-view showing a nozzle and nozzle tip sitting on top of the wafer plane.
Figure 2D:
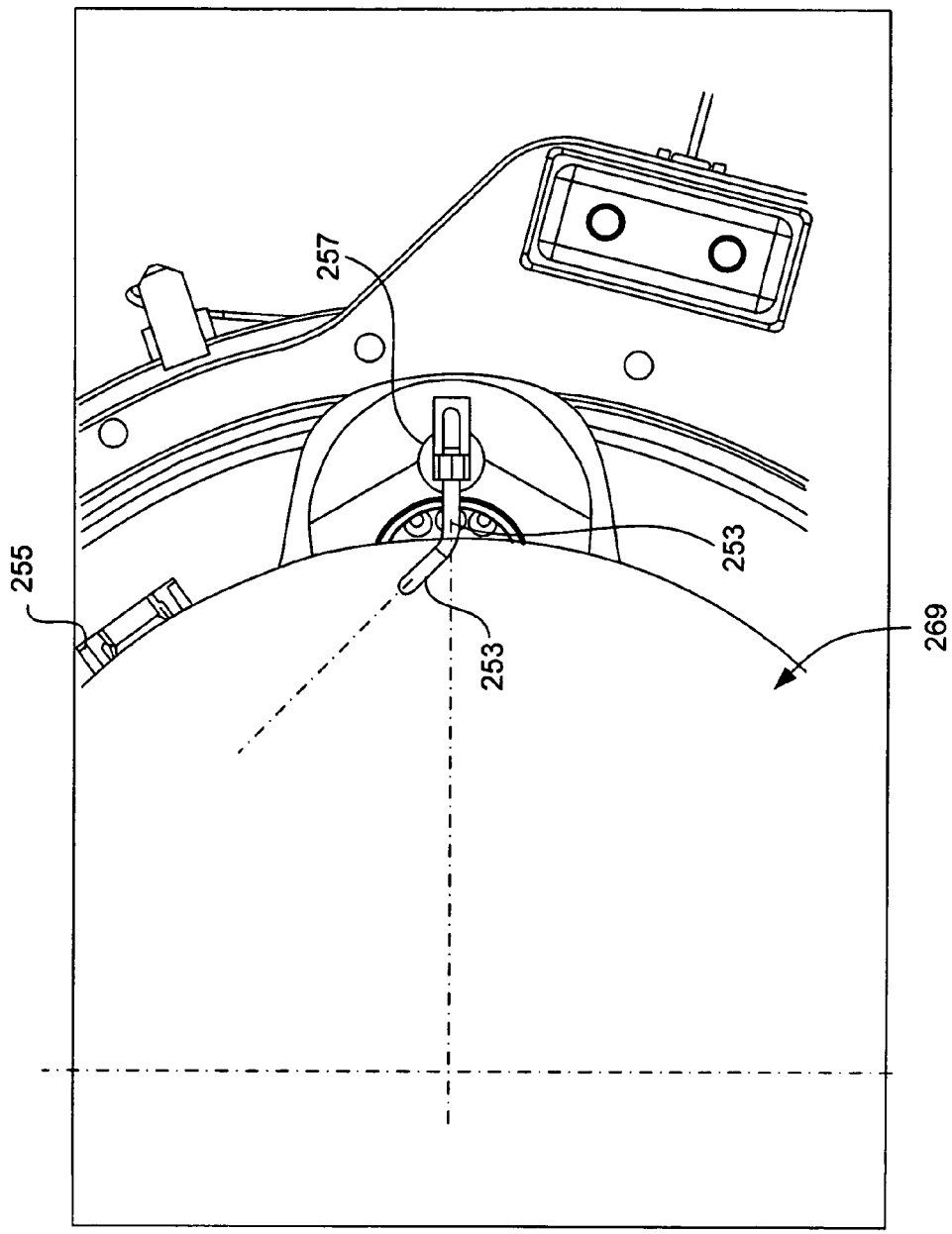
FIG. 2D is a top-view showing a nozzle and nozzle tip sitting on top of the wafer plane.

FIG. 2C is a side-view diagram showing some components of the apparatus used to deliver etchant during EBR, in accordance with one embodiment of this invention. A nozzle 251 delivers the etchant. It includes a nozzle tip 253 that can be manufactured as part of the same unitary part as the nozzle 251, but it is preferred that the nozzle tip 253 be a separate, replaceable piece, as will be discussed below. Also shown in this diagram are one of the chuck alignment pins 255 and the teach wafer plane 257 where the nozzle tip contacts during set-up and calibration. FIG. 2D is a top-view showing the same apparatus, including the nozzle 251, nozzle tip 253, wafer support clamp 255 and the wafer 269.

Figure 2E:
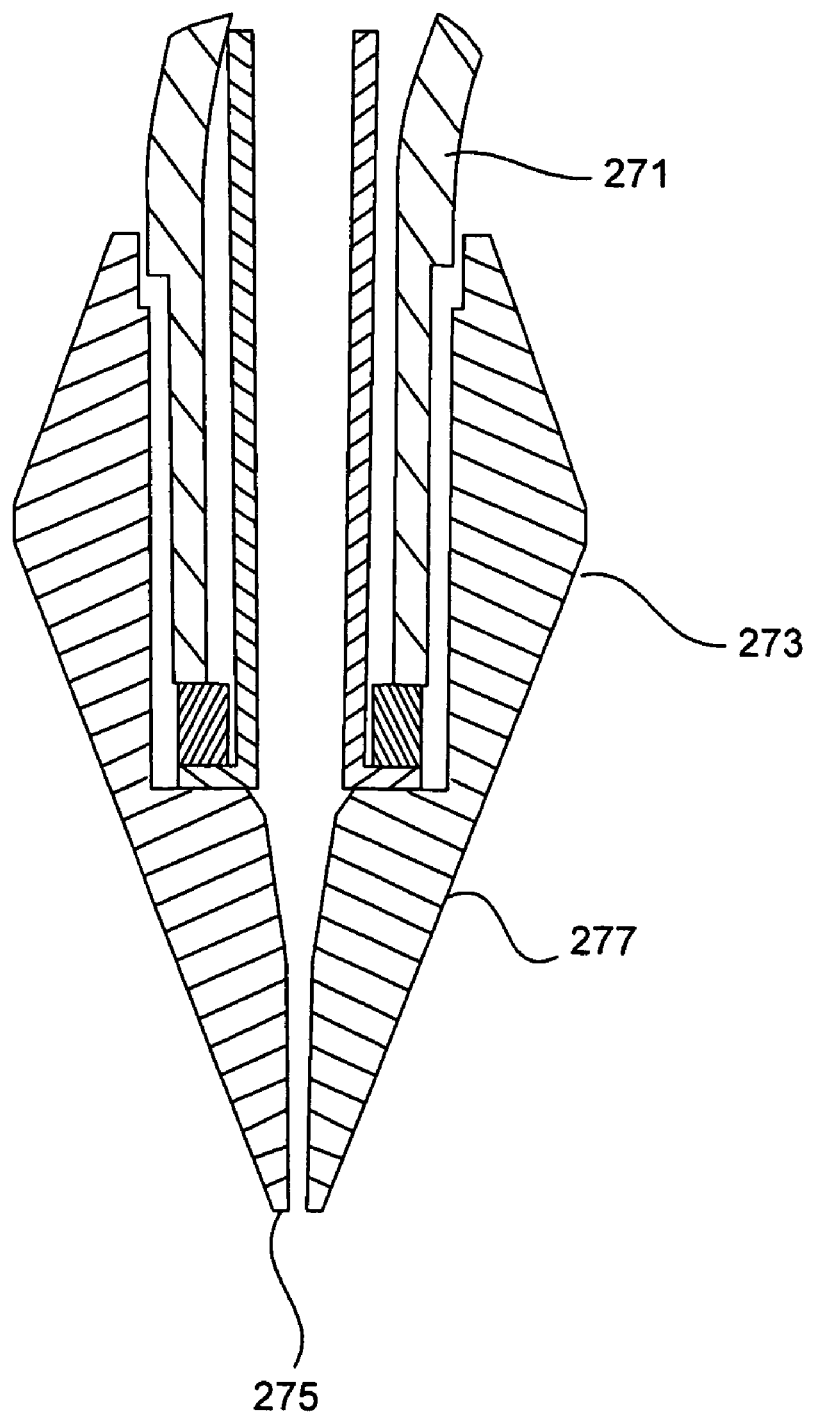
FIG. 2E is a close-up of a nozzle and nozzle tip, the nozzle tip being replaceable and precision drilled for the desired orifice size.

FIG. 2E is a detailed view of a nozzle 271, including a separate nozzle tip 273. It has been found that a nozzle orifice size of 0.016 to 0.017 inches works well with the preferred embodiments of this invention. However, it can be difficult to precisely and consistently manufacture the orifice to this size, and orifices of between 0.020 and 0.014 inches are typically produced in practice. Such variations can change the exit velocity by a factor of up to 2. Because the quality of the wafer surface (the presence or absence of streaking, spotting, etc.) is strong function of exit velocity, the nozzle orifice should be consistently sized to a precise diameter in each and every apparatus produced. This has not been possible with the existing design which relied on a tapered Teflon tube inserted into a soft PVDF nozzle tip to control the dispense stream size. Control of the tubing size and wear associated with the softer PVDF tip material limits the life and degrades the performance of the nozzle. It is therefore desirable to make a separate nozzle tip 273 that can be precision drilled and threaded onto the external surface of the nozzle piece 271. Preferably, a relatively hard, etchant-resistant, material such as PPS (polyphyenylene sulfide) or various chemically compatible ceramic materials (e.g. alumina or zeolite) is employed. FIG. 2E also shows the orifice 275 in the nozzle tip, as well as the inner flanged tube end 277 of the nozzle 271, that allow a tight seal between the nozzle 271 and nozzle tip 273.

Figure 3A:
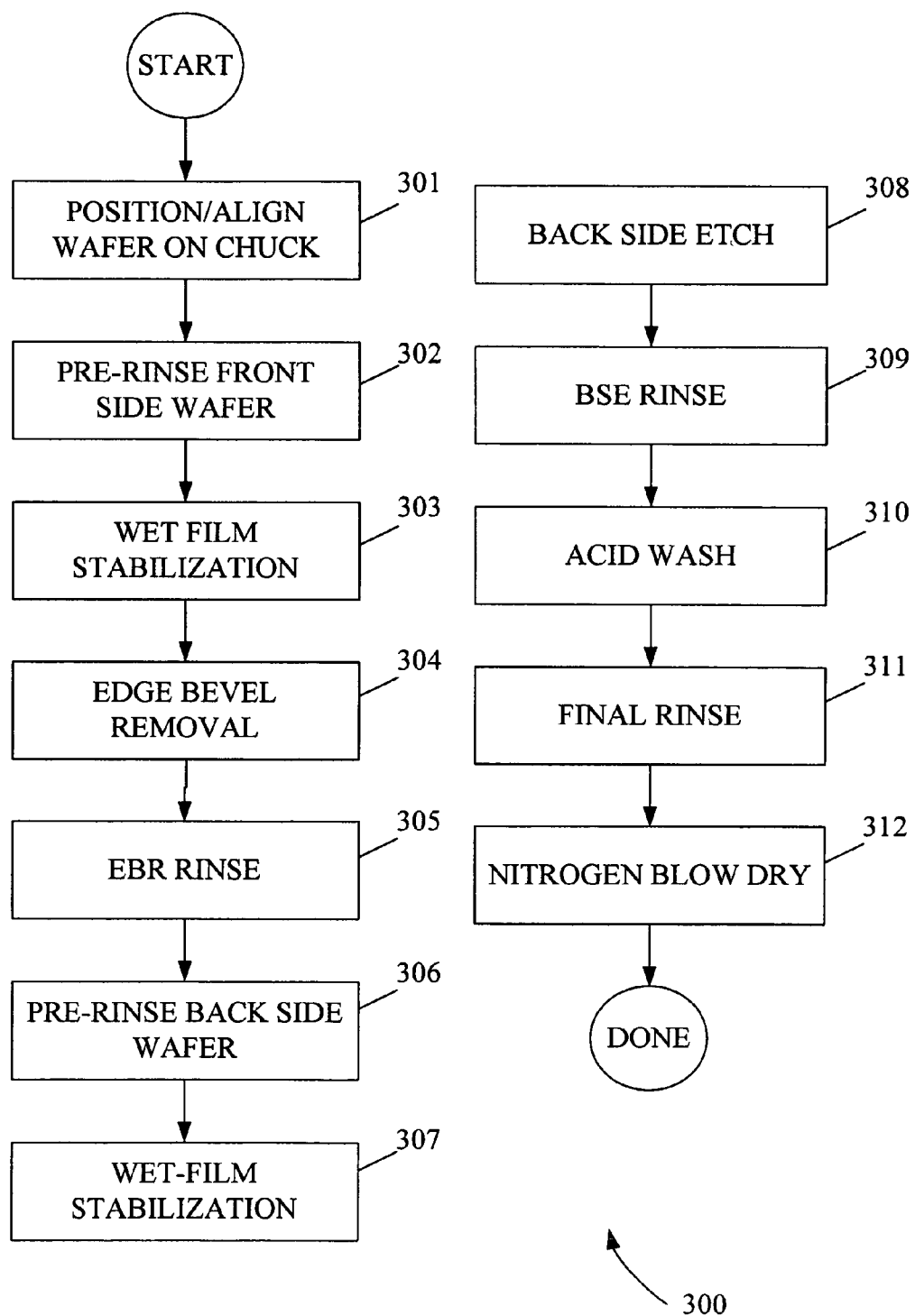
FIG. 3A is a process flow diagram illustrating a typical sequence of operations employed with a post-electrofill module in accordance with an embodiment of this invention.

A specific embodiment of the EBR process is illustrated in FIG. 3A. A second, preferred, embodiment will be described below. The depicted EBR process 300 can be carried out by a post-electrofill module, such as module 220 of FIG. 2A that is specifically designed to carry out the EBR process. The process begins at 301, with a robot arm placing the wafer on the module chuck for EBR processing. The wafer is placed into the chuck onto a set of support pins. The wafer is aligned inside the chuck by the vertical alignment pins. The support pins hold the wafer in place by static friction when the wafer is rotated. A vacuum chuck can also be used. After the robot arm retracts, deionized water is applied to the front of the wafer and the wafer is spun at about 150-400 rpm in order to pre-rinse the wafer of any particles and contaminants left over from previous processing steps. See 302. In the simplest embodiment, the pre-rinse operation employs only deionized water—no acid. The pre-rinse operation takes place 10 to 30 seconds with a flow rate of 200-800 ml/minute depending on rinse water temperature, plating chemistry, deionized water flow rate and the rotational speed of the wafer. It is sometime desirable to use hot rinse water to accelerate the pre-rinse efficiency. Therefore, DI water at from 20 to 50 C. can be employed depending on the economics of the operations.

The deionized water is then turned off and the wafer continues to spin at a speed of between about 150-350 rpm, which creates a uniformly thin layer of deionized water (wet-film stabilization). See 303. This wet-film stabilization facilitates an even distribution of the etchant over the front side of the wafer. At this time the wafer is in contact with the support pins only, the alignment pins have rotated away from the edge of the wafer and the clamps are at mid-position.

After wet-film stabilization 303, a core feature of the EBR, actual removal of the edge bevel metal 304 is performed. Typically, the wafer continues to be rotated but 0.5 to 3 seconds is allowed to elapse before EBR, in order to allow the deionized water to thin out. Operation 304 is typically carried out at about 150-400 rpm, more preferably –200 to 250 rpm for 200 mm wafer and 175 to 225 rpm for 300 mm wafers. This rate of rotation helps ensure that the entire edge exclusion area is covered by the EBR etchant. It is preferred to maintain the same pre-rinse and EBR speed to prevent the wafer from slipping off the support pins and de-centering during any acceleration/deceleration. During these operations the wafer is not held at a centering position. The rate of change in rotational velocity prior to the EBR step results in movement of the wafer on the support pins. Pins with greater friction coefficent are preferred as long as they do not flake or generate particles. Therefore, this parameter should also be controlled. It is preferred that the rate exceed about 150 rpm/sec when using typical plastic support pins (e.g. PPS or PVDF).

The EBR etchant is typically applied to the surface of the wafer using a thin nozzle tube, which has a nozzle opening at or near its end. When dispensing a small amount of fluid onto a surface as such, three flow regimes can generally result. The first regime is edge beading, where surface tension forces dominate the behavior of the fluid, the second is viscous flow, where viscous forces predominate, and the third is inertial, where inertial forces predominate and the fluid tends to spray. As explained below, the preferred flow regime for certain embodiments during fluid application is the viscous flow. In a specific example, an EBR dispense arm is positioned over the wafer edge as described below with reference to FIG. 4B.

In one embodiment, EBR is performed under the following conditions: a total of about 2 to 14 milliliters etchant is delivered at a rate of about 0.25 to 2 milliliters/second (more preferably about 0.3 to 0.5 milliliters/second) for a 200 millimeter wafer. The amount delivered depends on the film thickness to be removed, the concentration of chemical etchant, rotation rate and etchant temperature.

In a second, preferred, embodiment, the etchant is delivered in stages: a high flow rate stage followed by a lower flow rate stage. Alternatively, all the etchant may be delivered in the lower flow rate stage. In other words, the high flow rate stage is not performed. This embodiment is advantageously performed with a nozzle orifice diameter of about 0.016 to 0.017 inches. Note that the lower flow rate stage can employ flow rates of essentially zero, in which case no etchant is delivered for a period of time. Intermittent or pulsed delivery of etchant by this embodiment provides certain advantages such as allowing long contact times by relatively small amounts of etchant, thereby conserving raw materials, and minimizing splashing or splattering of the applied etchant and any related defectivity associated with that application.

Assuming that the high flow rate stage is performed, it involves delivering etchant to the wafer at a flow rate of about 0.5 to 1.5 cc/seconds for a duration of at most about 1 second. This stage helps break up surface tension resistance to wetting, forcing wetting at the edge of the wafer.

In the lower flow rate stage of the second embodiment (which may be the only stage), the etchant is delivered at a rate of about 0.15 to 0.35 cc/second (preferably about 0.3 cc/second) for about 20 to 60 seconds. In a specific embodiment (optimized for 1 micrometer thick films), about 8 cc of etchant is delivered over a period of approximately 25 seconds (which may vary depending upon flow rate). In another specific embodiment (optimized for 2 micrometer thick films), about 14 cc of etchant is applied over a period of about 45 seconds (which may vary depending upon flow rate). As mentioned, some applications employ intermittent delivery of etchant, in which there is a break in delivery between the high flow rate application step and the low flow rate step, or the case in which the lower flow rate stage can be viewed as employing a flow rate of 0 cc/second.

During EBR, some etchant may flow or otherwise be delivered onto the backside of the wafer and etch it. An alternative embodiment for practicing the present invention is to have the wafer facing upside down, and to apply the etchant to the backside edge.

After the required amount of liquid etchant has been applied to the edge of the wafer and allowed to contact the edge surface for an appropriate length of time, deionized water is again applied to the front side of the wafer as a post-EBR rinse 305. This application of deionized water will generally continue through the subsequent operations of backside etching and backside rinsing so as to protect the wafer from any extraneous backside etchant spray and damage. While the deionized water is applied, the dispense arm moves the etchant nozzle away from the wafer.

At generally about the same time as commencement of step 305, the backside of the wafer is pre-rinsed 206 with deionized water, which is wet-film stabilized 307 in much the same manner that the front side of the wafer was (e.g., the wafer rotation speed is held at about 350 to 500 rpm). After the flow of deionized water to the wafer backside ends, a backside etch operation 308 is performed—generally with the same etchant that was used for the EBR. In a specific embodiment, a thin jet (initially 0.02 to 0.04 inches in diameter) of liquid etchant is aimed at the center of the wafer backside. The etchant is preferably delivered from a tubular nozzle having a diameter of about 0.02 to 0.04 inches and a length of at least about 5 times the diameter. This etchant then disperses over the entire backside of the wafer. The purpose of the BSE is to remove any residual copper that was formed on the backside of the wafer during formation of the seed layer of PVD copper. The BSE etchant is typically applied using a spray nozzle. Despite gravity, surface tension generally keeps the etchant in contact with the bottom of the wafer long enough to carry out BSE. Since the chuck arms could interfere with the spraying of etchant on the backside of the wafer, the angle of the spray nozzle may be varied during BSE to ensure thorough application of the etchant. Because the wafer is generally held up by support pins that impinge on the backside of the wafer, the process is generally carried out at two different speeds to ensure that the etchant flows adequately over the entire surface. For instance, the wafer may be rotated at about 350 rpm during part of the BSE and then rotated at 500-700 rpm for the remainder of the BSE. The portions of the backside blocked by the arms will differ at the two speeds, thus ensuring complete coverage. Overall, the BSE process typically takes 1-4 seconds and uses 1 to 5 cubic centimeters of the preferred etchant described below to reduce the concentration of copper on the backside to less than $5 \times 10^{-10}$ atoms per $cm^2$ of substrate.

After BSE, both sides of the wafer (or at least the backside of the wafer) are rinsed with deionized water to rinse any liquid etchant, particles and contaminants remaining from the BSE. See 309. Then the flow of deionized water to the front side ends and about 2 to 4 milliliters of a dilute acid, generally less than about 15% by weight acid, is applied to the front side of the wafer to remove residual metal oxide and remove the associated discoloration. See 311. In a specific embodiment, the acid is applied at a rate of about 2 cc/sec. After the acid rinse, deionized water is once again applied to both sides of the wafer, or at least the front side, to rinse the acid from the wafer. In a specific embodiment, the deionized water is applied for about 15-30 seconds at about 300-400 milliliters/min. Finally the wafer can be spun and blow-dried, as desired, on both sides with nitrogen. See 312. Generally, any drying step is carried out at about 750-2000 rpm for about 10 to 60 seconds, and necessitates a clamping for the wafer once it reaches about 750 rpm. Many embodiments for the clamping mechanism are possible, and some of these are discussed in more detail below. After this processing in the PEM is completed, a robot arm picks up the wafer and puts it in a cassette.

A second, especially preferred, embodiment of the EBR process is now described with reference to FIGS. 3A and 3B. This embodiment is particularly effective at eliminating streaking and narrowing the taper of the wafer. As with the previously described embodiment, this process can be carried out by a post-electrofill module, such as module 220 of FIG. 2A. The entire process is conducted at a rotation speed of between about 150-400 rpm. In one specific embodiment, the rotational speed is about 225 rpm and in another specific embodiment, the rotational speed is about 350 rpm. So initially, the wafer is accelerated up to a processing speed of 225 rpm, or whatever speed is chosen for the process at hand. In the context of FIG. 3A, this may be viewed as part of operation 301.

As indicated above, the wafer is pre-rinsed with deionized water applied to the front of the wafer, while the wafer is spun at about 150-400 rpm. See 302. For this second embodiment, the pre-rinse operation is performed in multiple sub-operations. FIG. 3B depicts these sub-operations, which correspond to operations 302 and 303 of FIG. 3A.

The pre-wet conditions are driven by two goals: (1) providing a taper width of 400 micrometers or in that neighborhood and (2) performing prewetting rapidly so as to maintain a high throughput. Ideally, the full prewetting operation will take no longer than about 6 seconds (more preferably not longer than about 4.5 seconds). In some cases the pre-wet operation is combined with a global application of an isotropic etchant, such as described in U.S. patent application Ser. No. 10/690,084, previously incorporated by reference. The goal of the etching operating is to remove a metal film of between about 10 and 200 Angstroms substantially uniformly from the wafer surface.

The prewet must be sufficiently long so that the edge bevel etch can proceed rapidly and produce the desired 200-400 micrometer taper width. It is believed (although not proven) that the pre-wet or etch operations helps removes residual electroplating additives (e.g. accelerators and/or suppressors) that protect the copper from rapid attack by the edge bevel etchant.

The taper is generically defined as the transition from a region with full metalization (e.g., the inner or active area of the wafer including all the dies) to a region without metal (e.g., the edge exclusion area). The taper is typically measured from a region of 95% metal thickness to 0% metal thickness. With the EBR method as described, the wafer typically starts with a taper of about 700 micrometers or more.

Figure 3B:
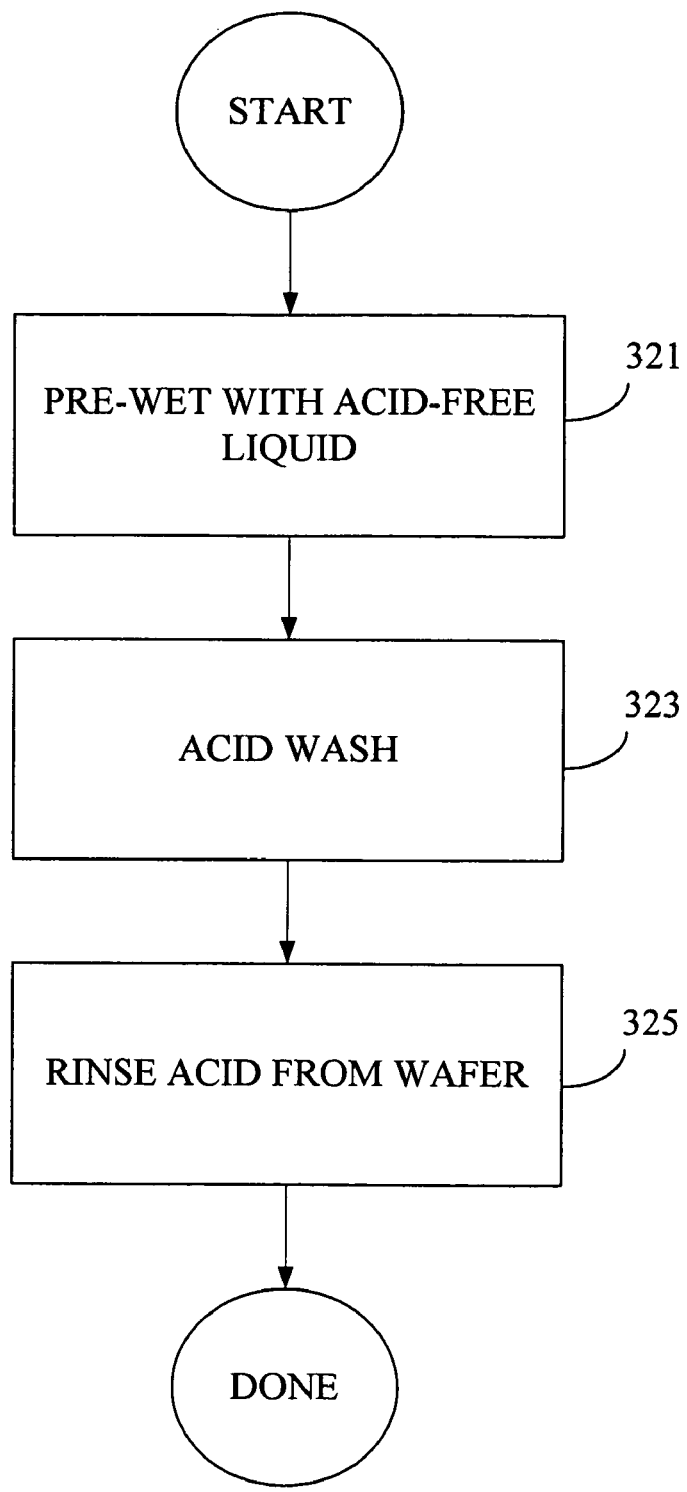
FIG. 3B is a process flow diagram depicting a pre-rinse operation in accordance with an especially preferred embodiment of this invention.

In a preferred embodiment depicted in FIG. 3B, used with conventional plating chemistries, the pre-wet operation includes three suboperations. Initially, at 321, the system delivers about 400-1000 ml/minute deionized water for about 2-4 seconds (preferably about 600 ml/minute for about 2 seconds). Note that this rate may be doubled or increased by other multiple if two of more deionized water nozzles are employed. Thus, one embodiment of this invention employs two or more nozzles.

Second, at 323, the system delivers about 0.5 to 2 ml (preferably about 1 ml) of about 4-6% sulfuric acid for about 0.1 to 2 seconds (at about 1-4 ml/second—preferably for about 0.5 seconds) and concurrently deliver deionized water at about 400-1000 ml/minute for about 0.1 to 2 seconds (preferably about 600 ml/minute for about 0.5 seconds). This suboperation may employ two separate nozzles/delivery lines. For example, referring to FIG. 2A, deionized water is delivered via line 238 and sulfuric acid is concurrently delivered through line 250. Note that the flow of deionized water may be continuous between suboperations 321 and 323—although this is not necessary. Alternatively, a pre-etch operation of similar duration and flow can be employed.

Third, at 325, the system delivers about 400-1000 ml/minute deionized water for about 2-4 seconds (preferably about 600 ml/minute for about 2 seconds). Again, the flow of deionized water may be continuous—in this case between suboperations 323 and 325—although this is not necessary.

During all pre-wet or etching suboperations, the wafer rotational speed is preferably maintained at about 150 to 400 rpm. (For 200 mm wafers, 225 or 350 rpm may be used.) In all embodiments, the length of the pre-wet operation depends on the plating chemistry and the rotational speed of the wafer. If the plating chemistry includes high concentrations of accelerators or suppressors, then relatively longer pre-wet times may be required. If the rotational speed is relatively fast or the rinse water hot or etchant strong, then shorter pre-wet or etch times are necessary.

The total pre-wet or etching operation is typically carried out for about 4-24 seconds at room temperature, with a decrease of about a factor of 2 for every 10° C. increase in temperature. The parameters of the pre-wetting ensure that the entire front side of the wafer is rinsed or etched, including the areas that were excluded from electrofill by the clamshell lip seal.

After these pre-wet operations, the process is conducted in the manner described above, beginning at block 304. This second embodiment of the invention will preferably reduce the taper of the wafer to about 200 micrometers. In addition to narrowing the taper, the embodiment can also be used to remove electrofilled copper, which commonly reaches thicknesses 1 or even 2 micrometers. The thin taper widths provided by this invention are particularly well-suited for processes including subsequent CMP. Further, the processing of this embodiment is particularly effective at preventing streaks, which are areas of localized film oxidation on the wafer. Streaking is caused by the presence of dilute EBR etching fluid landing on unwanted areas of the wafer (typically after contact with the module wall), and is typically characterized by regions of oxidation of 50 Å or more in thickness. The streaks can be determined by visual inspection or defect analysis instrumentation such as an AIT defect analyzer (made by KLA/Tencor). The addition of a rinse deflector attached to the module wall can also be used to prevent deflection of the etchant back onto the wafer surface.

Turning again to FIGS. 2A and 2B, some features of the PEM will be described in further detail. First, note that wafer 224 rides on support pins 285 (located on wafer chuck arms 281) by static friction. Preferably, the support pins 285 are located from about 5 to 20 millimeters, more preferably about 5 to 10 millimeters, in from the edge of wafer 224. The design of the support pins is determined by the need to supply enough friction to 1) keep the wafer from flying off the chuck if it is aligned slightly off center (i.e. when aligned to the tolerance of the specification of the edge bevel removal process), 2) not slip as the wafer is accelerated (at typically a rate of 50 to 300 rpm/sec (100 rpm/sec in a specific embodiment)) from rest to the EBR rotation rate, and 3) not shed or generate particles. As the wafer's rotational speed increases, however, it reaches a velocity at which the static friction from resting on the pins can no longer constrain it due to small misalignments and the associated centripetal force. To prevent the wafer from flying off chuck 226 at such velocities, clamping cams 287 may be employed. The design of suitable cams is described below. For now, simply understand that at defined wafer rotational velocities, the clamping cams rotate into a position that locks wafer 224 in place.

Next note that a dispense-arm 283 functions to hold the dispense nozzle 256 and move the nozzle into an accurately controlled location over the wafer 224 during the etching step of the process. The dispense-arm design is not particularly restrictive. It can move down from above the wafer, in from the side, swing in from the edge, rotate down from above, or any combination of these movements. However, the location of the nozzle is preferably reproducibly accurate to within less than about 0.05 mm (more typically less than about 0.02 mm) so that the etched region is mechanically under control. Any suitable pneumatic actuator, solenoid, motor controlled gear, or servo controlled motor can activate the arm. The dispense-arm should move the dispense nozzle accurately to the edge of the wafer and move the nozzle out of the way to allow the wafer to be transferred into and out of the chuck. The materials of construction should be resistant to the particular chemical etching solution used. If the preferred etchant disclosed herein is used, certain stainless steels (e.g. 303, 625, 316L etc.), ceramics ($Al_2O_3$, zirconia), tantalum, and plastic coated metals (polypropylene, polyethylene, PTFE, PVDF, PPS; poly-phenylene sulfide) are good choices because they will resist chemical attack, and have sufficient mechanical strength (without creep or flow) to maintain the necessary stringent mechanical tolerances. Similar design considerations hold for the wafer chuck.

Figure 4A:
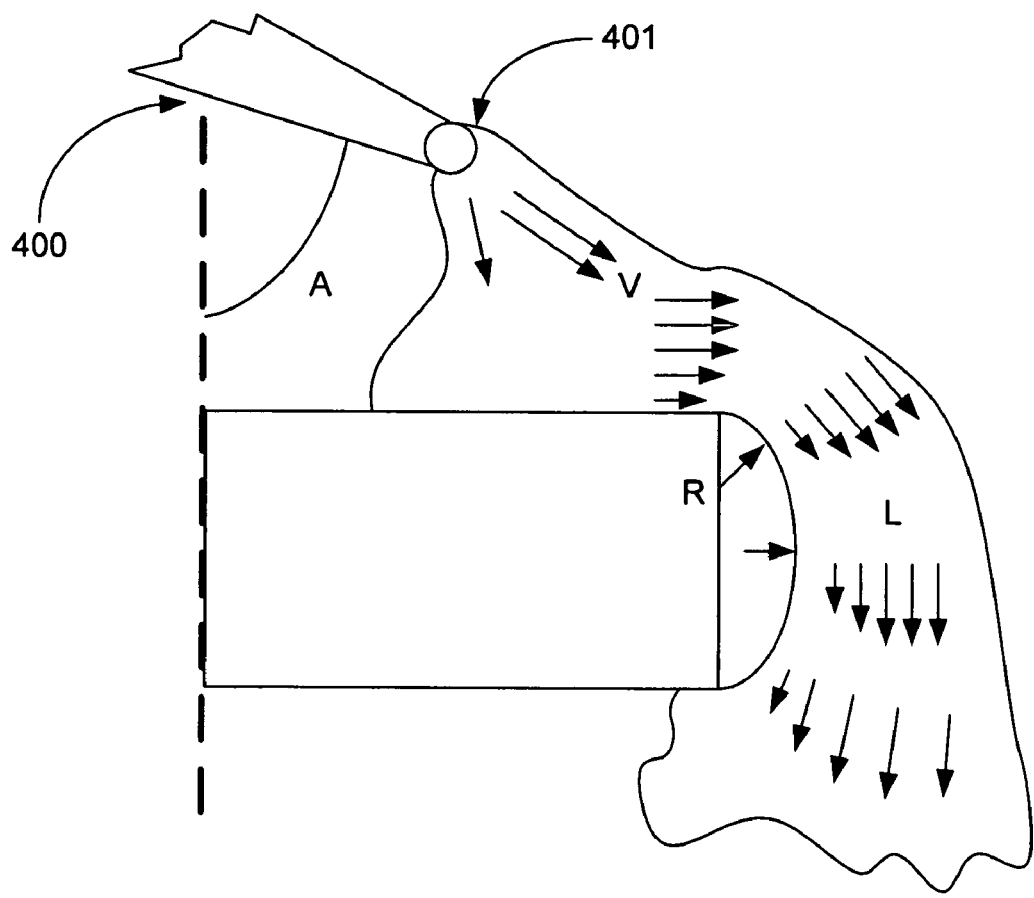
FIG. 4A is a schematic illustration of etchant being delivered to a wafer edge bevel via an etchant dispensing nozzle in a manner that constrains the etchant to the edge bevel region of the wafer.

FIG. 4A schematically shows a nozzle 400 delivering etchant to the front of the wafer for EBR. Relevant parameters for defining the desired etchant flow regime include (i) the thickness of the fluid stream (L), which is essentially determined by the diameter of the nozzle, (ii) the radius of curvature of the wafer (R), and (iii) the radial velocity of the fluid stream (V), which is determined by the radial component of the etchant's exit velocity from the nozzle and to some degree the centripetal acceleration from rotation of the wafer. In a plane containing the normal to the wafer, the nozzle 401 may be angled by "A" degrees (generally between about 30 to 70 degrees) with respect to the normal of the wafer. The component of the etchant's exit velocity from the slot nozzle in the plane of the wafer is thus the product of the total exit velocity and sin(A). The viscosity ($\mu$) and density ($\rho$) of the etchant fluid also contribute to the flow regime function. The nozzle also is angled rotationally at 0 to 90 degrees with respect to the wafer tangent in the plane of the wafer.

Figure 4B:
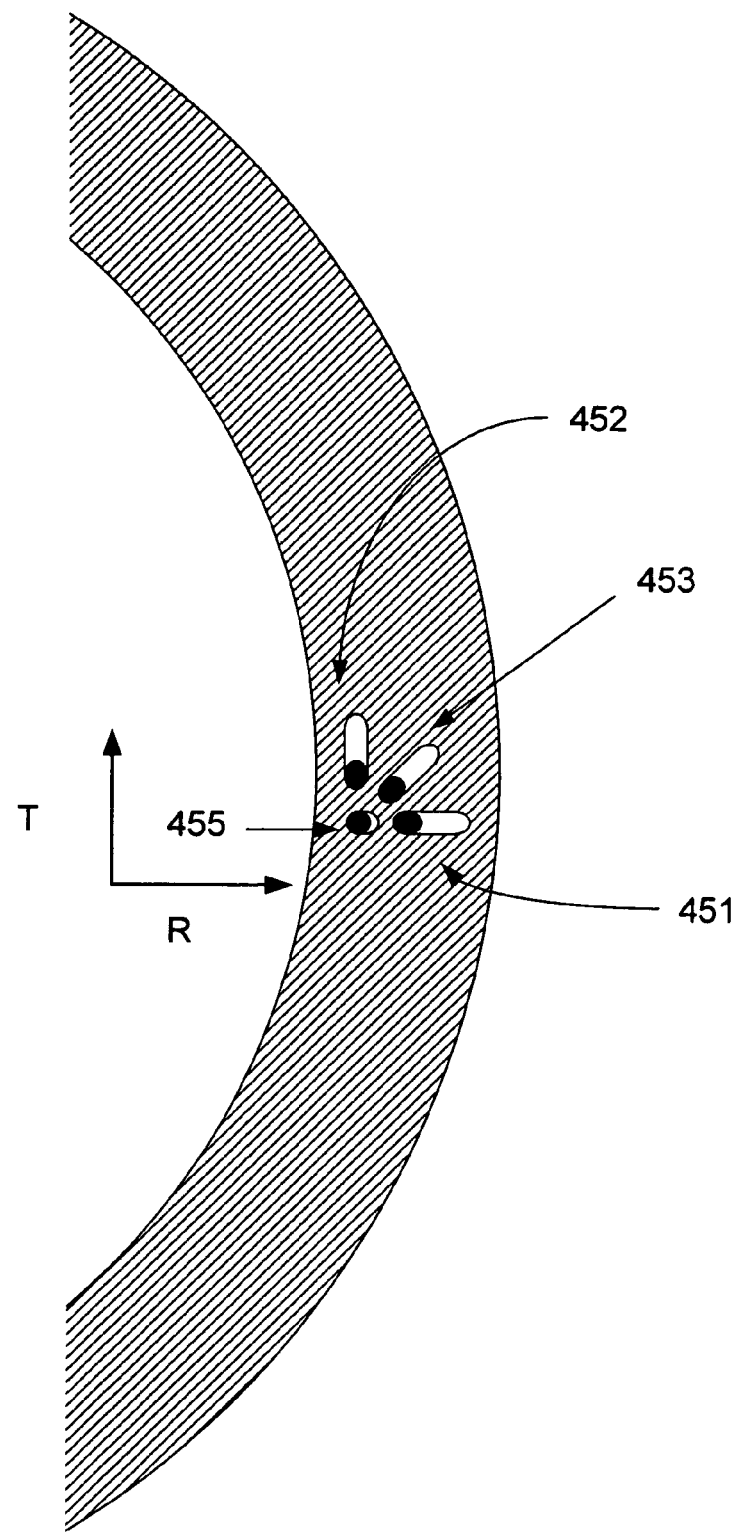
FIG. 4B is a top view of a wafer on which etchant is delivered at a controlled orientation via an etchant delivery nozzle.

FIG. 4B schematically shows a nozzle at four different orientations with respect to a wafer. Each orientation differs from the others in its angle with respect to the wafer's tangent and/or its angle with respect to the wafer's normal (the "z-direction" out of the plane of the page). Considering first the radial/tangential angle (in the plane of the wafer), if the nozzle is angled purely in the radial direction R (90 degrees with respect to the wafer tangent), then it will deliver etchant fluid with a radial angle as shown by nozzle 451. And if the nozzle is angled purely in the tangential direction T (0 degrees with respect to the wafer tangent), then it will deliver etchant fluid with a tangential angle as shown by nozzle 452. The nozzle can and often is angled somewhere between the purely radial and purely tangential directions as illustrated by nozzle 453. As explained, the nozzle orientation can also vary with respect to the wafer normal. Each of nozzles 451, 452, and 453 is angled to the same degree with respect to the wafer normal. Nozzle 455, however, is more steeply angled toward the normal.

As mentioned, the three flow regimes of interest include (i) edge beading, where surface tension forces dominate the behavior of the fluid, (ii) viscous flow, where viscous forces predominate, and (iii) inertial, where inertial forces predominate and the fluid tends to spray. Several experimental observations and calculated trends were made. Larger nozzles and high flow velocities lead to thicker fluid films with more inertia, which tend to fly off the edge of the wafer rather than wrap around the side and back. Combinations of low flow, low rotation, and a wide nozzle result in films that bead at the edge, and sporadically weep from the edge to the back, where they fly off in spurts. A high rotation rate results in very short etchant/surface exposure times and the etchant flying off the front surface (not wetting the sides and back). The experiments and calculations indicate that the thickness of the applied etchant stream should be approximately the same size or smaller than the radius of curvature of the wafer edge. There are a range of flow rates (fluid velocities) and rotation rate that are effective in producing the required viscous flow conditions. Generally, lower flow rates were effective with higher rotation rates and vice versa.

The three flow regimes can be approximately correlated to values of a dimensionless number given by $\mu R/VL^2\pi$. The parameters of this dimensionless number were discussed above in conjunction with FIG. 4A. Using this dimensionless number, numbers above about 0.001 correspond to the edge beading regime, numbers below about 0.0001 correspond to the inertial regime, and numbers in between these correspond to the viscous flow regime.

Edge beading is not desirable for practicing certain embodiments of the invention because in this regime the fluid forms in droplets rather than evenly flowing over the surface of the wafer. In addition, the movement of such droplets is somewhat unpredictable, and they can flow in from the front edge of the wafer, where the fluid is dispensed from the nozzle, back toward the center. The inertial regime is undesirable in some cases because in this regime the fluid tends to "fly off" the front edge of the wafer, due to the radial component of the fluid's velocity, rather than flowing over the side edge. This radial velocity is a result of the exit velocity of the fluid from the nozzle and to a smaller degree the centripetal acceleration of the rotating wafer. In certain embodiments, the viscous regime is the regime one wishes to operate in because in this regime the fluid evenly covers the front edge of the wafer where the etchant is applied. The viscous fluid also flows over the side edge and to some degree the back edge of the wafer due to the radial component of the fluid's velocity.

Using typical etchant solutions, such as the preferred $H_2SO_4$ and $H_2O_2$ solution described below, it has generally been found that the thickness of the etchant stream as delivered to the wafer should be about the same size or slightly smaller than the radius of curvature of the wafer. Using the preferred etchant, and processing a standard wafer of 200 millimeters diameter, 0.75 millimeters thickness and 0.15 millimeter radius of curvature, the following parameters were found to have worked well: a nozzle diameter of between about 0.4 to 0.5 mm, a wafer rotation rate of between about 100 and 500 rpm, an exit velocity of between about 40 and 400 cm/sec, a angle for the nozzle of 30 to 70 degrees from the normal of the wafer, and a rotation angle for the nozzle of about 0 to 90 degrees with respect to the direction of rotation (the tangential direction, T, of FIG. 4B). It is generally desirable to have the nozzle located as close to the wafer as mechanically practical. Further, the location of the nozzle with respect to the wafer edge, combined with its location above the wafer, determines the etching region which is dependent on the particular application. It has been found that the EBR works well when the nozzle exit is about 0.3 to 5 millimeters above the surface of the wafer, and about 0 to 5 millimeters inside its outer edge. The nozzle tube generally should be narrow and long enough to ensure that the fluid exits in a stream that stays roughly parallel before it hits the wafer.

In particularly preferred embodiment, an angle of about 45 degrees from the normal (toward the edge of the wafer along a radial line) is used, and about 0-45 degrees radially in the direction of rotation (along a line parallel to the tangent of the wafer), more preferably 25-35 degrees, is used. In this case, the nozzle orifice is offset from the edge of the wafer by about 1.5 to 4.5 millimeters. This embodiment is particularly effective at eliminating streaking and reducing the taper of the wafer. The angular and translational positions of the nozzle can be controlled using conventional actuators, such as screw actuators.

The rotation rates specified herein were determined through experimentation and calculation, specifically for a 200 millimeter wafer part size and specific viscosity of etchant. However, the invention is not specific to that part size or etchant viscosity. Similar experiments and calculations can be performed to optimize the nozzle size, viscosity, flow conditions and rotation rates for other wafer sizes. The appropriate rotation rate for other size wafers can be estimated by maintaining the same centrifugal acceleration ($v^2/r$). Since the tangential velocity is $v=2\pi\omega r/60$ ($\omega$ is the rotation rate in rpm, r is the wafer radius in cm, v is the velocity in cm/sec), the centrifugal acceleration is given by $a_c=(2\pi\omega/60)^2 r$. Therefore, neglecting viscous forces and time of flight considerations, the appropriate scaling is therefore $r_1/r_2=\omega_2^2/\omega_1^2$.

The nozzle hole diameter should be optimized along with the flow velocity and rotation rate to apply a continuous film of fluid onto the wafer. Maintaining the nozzle hole diameter over a fixed potion of nozzle length is necessary to develop an approximately parallel (non-diverging) exiting fluid flow profile. The fluid nozzle impingement imparts a sufficiently large radial velocity component so that the fluid will rapidly flow around the wafer edge. Preferably, the nozzle shape is tubular. In a specific embodiment, the nozzle is tubular and about 0.5 to 1 millimeter in length.

In an alternative embodiment, the nozzle has a slot shape. If a slot nozzle is used, its length should be determined with reference to the width of the etched region (ring) that is to be produced. The slot width should be small enough so as to minimize chemical usage, splashing of etchant, and beading of the dispensing volume (avoiding the dispense having discrete drops rather than a stream). Typical slot nozzles tested that were found to be effective were about 2-4 millimeters in length, allowing application of etchant over 1-5 mm of the wafer edge. Useful slot widths were in the range of about 0.1-0.3 millimeters.

Keep in mind that a large tube (dispensing spray diameters approaching the dimensions of the edge to be etched) could be used, but would not be as efficient as the approaches described here because of the large amount of fluid needed. The use of the larger flow volume near the rotating chuck cams and arms also increases the propensity for splashing back onto the front side device areas of the wafer as well. The disclosed design enables controlled dispensing of the etchant from the top of the wafer, over the side, to the back edge, and even controlled removal of the metal from the underside edge of the wafer, without physically touching the wafer and thereby contacting the active surface.

In certain embodiments, the etchant is applied such that it does not flow or at least not flow continuously over the edges of work piece. Rather, it remains stationary or moves very slowly over edge region for a period of time. Under such conditions, a balance in the forces of surface tension (tending to wick the applied liquid away from the point of application) and centripetal force (opposing this tendency) are balanced. This embodiment has the advantage of using less materials and diminishing the likelihood of etchant splattering and defectivity. Thus, while it is often beneficial to apply a continuously flowing fluid in, e.g., the viscous flow regime, certain embodiments of the invention employ etchant delivery means in which the etchant stops flowing, at least temporarily or intermittently. With intermittent delivery, the etchant may have relatively long residence times on the edge areas. For example, in one embodiment, the etchant remains stationary on the edge bevel area for a period of between about 1 and 60 seconds (e.g., 2-30 seconds). In a specific embodiment, a wafer is prewetted in the manner described above, for example, followed by delivery of etchant solution at the edge bevel region of the wafer at rapid rotation or other conditions that facilitate even distribution over the entire region where copper is to be removed. The delivery of etchant in this manner may take between about 1 and 5 seconds, for example. Thereafter, the wafer conditions are changed such that the etchant no longer flows, but instead remains stationary on the wafer surface. This may be accomplished by stopping or more preferably slowing wafer rotation for a period of about 1 to 60 seconds (e.g., about 2-30 seconds). Thereafter, the used etchant is removed by, for example, rinsing while increasing the wafer's rotational speed.

In some cases, the edge bevel etching process takes multiple cycles of (1) etchant application, (2) stationary contact of etchant with edge regions, and (3) etchant removal. Some or all of the cycles may employ a preliminary prewet step to facilitate even distribution of etchant over the edge region. Intermittent etchant delivery such as this may employ 1 to about 10 cycles in typical cases.

Various considerations influence the choice of a liquid etchant. As mentioned above, the liquid etchant should etch the unwanted metal rapidly at room temperature (e.g., >400 Å/sec). But, it should not aggressively attack the mechanical and electrical components of the etch system. Nor should it generate dangerous by-products during the etching reaction. Preferably, the components of the liquid etchant should include only those materials readily available in normal integrated circuit manufacturing facilities. Other beneficial properties of a liquid etchant include a long shelf life (preferably without stabilizers), a consistent etching rate over time, low cost, and environmental friendliness.

Preferably, the liquid etchant includes an acid and oxidizer. Examples of acids that are useful include sulfuric acid, hydrohalic acids, chromic acid and nitric acid. A preferred etchant for copper EBR is a solution of $H_2SO_4$ (sulfuric acid) and $H_2O_2$ (hydrogen peroxide) in water. A preferred composition of the etchant is 1.4% to 10% $H_2SO_4$ by weight (preferably 2.5% to 7.5%) and 3.5% to 7.5% $H_2O_2$ by weight (preferably 3.5% to 6.5%).

It has been found that this relatively dilute mixture of hydrogen peroxide and sulfuric acid provides an etchant with an excellent rate of copper etch. In storage, the etchant maintains a sufficiently high etch rate for over a month. Alternatively, dilute (about 2-15% by weight) acid and peroxide can be stored in separate containers and mixed in a small tank for short-term storage prior to use, or mixed on-line just prior to their use. There is an exothermic release with the mixing, but it is small at these dilute concentrations. Either of these mixing approaches is effective and preferred, since sulfuric acid is a stable compound, and low concentration hydrogen peroxide (e.g., <10%) can be safely stored for over a year with stabilizers well-known in the art. A system and method for in-line mixing and delivery of this preferred etchant is described in below. See also U.S. Pat. No. 6,333,275, previously incorporated by reference. Processing of the etchant after use is not difficult and is generally compatible with waste-treatment methods that are used to process copper electroplating solutions as well.

While sulfuric acid and hydrogen peroxide work well in these capacities, the invention is not so limited. Note that if an oxidant other than hydrogen peroxide is used, some of the precautions described herein against generating oxygen bubbles can be eliminated. Also, if an acid other than sulfuric acid is used, some of the precautions against the exothermic mixing reaction can be eliminated. Two possible, but less preferred, etchant includes $S_2O_8^{-2}$ (peroxydisulfate) and concentrated $HNO_3$ (~30% in water), which is described in U.S. Pat. No. 5,486,234, which is herein incorporated by reference in its entirety.

Generally, the liquid etchant should have physical properties compatible with the etching system. The viscosity and density should allow easy delivery onto the semiconductor wafer in a desired flow regime (e.g., a viscous flow regime). It has been found that the fluid properties of the most effective etchants are very similar to those of water (e.g., surface tension, contact angle, and viscosity). The above-described dilute sulfuric acid/hydrogen peroxide etchant meets this requirement.

Figure 5A:
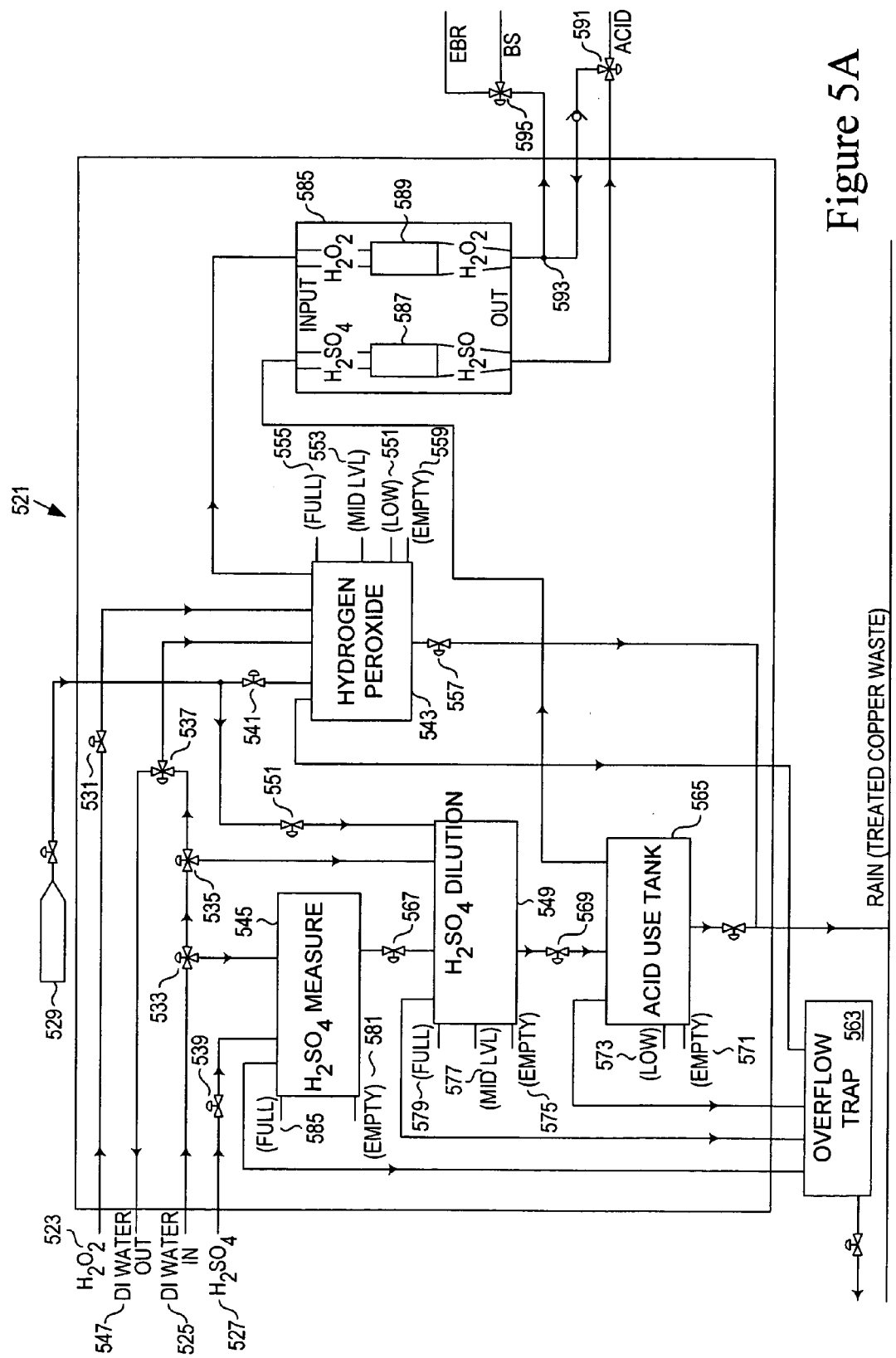
FIG. 5A is a block diagram illustrating various elements of a chemical dilution module in accordance with one embodiment of this invention.

FIG. 5A depicts one example of a suitable chemical dilution module 521 for use with this invention. Dilution module 521 should provide liquid acid and liquid etchant to the post electrofill module at appropriate concentrations and flow rates. It should also provide these liquid reagents free of gas bubbles and substantial concentrations of dissolved gas.

In the depicted example, inputs to the chemical dilution module 521 include a source of concentrated hydrogen peroxide 523, a source of deionized water 525, and a source of concentrated sulfuric acid 527. Preferably each of these three sources are from central sources available in the integrated circuit fabrication facility. Typically, concentrated hydrogen peroxide, as provided via source 523, comes in one of two grades, corresponding to approximately 30% and approximately 60% by weight. Typically the concentrated sulfuric acid is provided at a concentration of approximately 96%. The remaining input to module 521 is a nitrogen source 529. This may be the same source as used in the post electrofill module 520 (source 530). It is used to purge dissolved oxygen gas from hydrogen peroxide in module 521. It may also be used to facilitate mixing of the water and hydrogen peroxide, and water and sulfuric acid. Inert gases other than nitrogen (e.g., argon or helium) may be used in place of nitrogen.

The various input streams are controlled by separate valves within module 521. For example, the concentrated hydrogen peroxide stream is controlled by a valve 531 which controls delivery of the concentrated hydrogen peroxide to a hydrogen peroxide reservoir 543. The stream of concentrated sulfuric acid is controlled by a valve 539 which allows delivery of the concentrated acid to a sulfuric acid measure tank 545. The nitrogen from source 529 is controlled by a valve 541 which allows introduction of the nitrogen into peroxide reservoir 543. Deionized water from source 525 is provided to three separate tanks under the control of valve 533, 535, and 537. Deionized water that is not delivered to one of these three tanks exits from module 521 via a deionized water outlet 547. Valve 533 controls delivery of deionized water to the sulfuric acid measure tank 545. Valve 535 controls delivery of deionized water to a sulfuric acid dilution tank 549. Valve 537 controls delivery of the deionized water to peroxide reservoir 543. Note that a valve 551 controls delivery of the gaseous nitrogen to sulfuric acid dilution tank 549.

Considering now hydrogen peroxide reservoir 543, this tank provides a ready supply of appropriately diluted hydrogen peroxide ready for mixture with appropriately diluted sulfuric acid to create the liquid etchant for the post electrofill module. Concentrated hydrogen peroxide from source 523 and deionized water from source 525 are mixed within reservoir 543 to provide peroxide at the appropriate concentration. Preferably, the hydrogen peroxide is diluted to a concentration of approximately 15% in reservoir 543. A steady stream of nitrogen from source 529 bubbles through the diluted hydrogen peroxide in tank 543. This serves to purge dissolved oxygen from the diluted hydrogen peroxide. Such dissolved oxygen could create gas bubbles in the etchant delivered to module 520. As mentioned, such bubbles can have various deleterious effects on the etching process.

To facilitate peroxide dilution, tank 543 includes a low level sensor 551, a mid-level sensor 553, and a full sensor 555. When peroxide in tank 543 drops to the level of sensor 551, module 521 begins delivering concentrated peroxide from source 523. When the concentrated peroxide reaches the level of sensor 553, the module stops delivering concentrated peroxide. It then delivers deionized water from source 525 until the total level within reservoir 543 reaches the height of sensor 555. At this point, reservoir 543 is full and no further liquid is delivered.

Peroxide reservoir 543 is outfitted with a drain valve 557, which allows hydrogen peroxide to be drained from the module 521 when necessary. Further, reservoir 543 includes an empty level sensor 559. This may be used to stop the process in the event that tank filling did not occur as required. Still further, reservoir 543 is outfitted with an overfill line 561 which drains to an overflow trap 563 for module 521.

Sulfuric acid concentration is controlled via three separate tanks: the measure tank 545, the dilution tank 549, and an acid use tank 565. Sulfuric acid stored in measure tank 545 is at the same concentration as the acid from source 527. It is provided to dilution tank 549 via a valve 567 diluted acid from dilution tank 549 is provided to acid use tank 565 via a valve 569. Acid from use tank 565 is delivered directly to a post electrofill module (as source 546, for example) or mixed with hydrogen peroxide from reservoir 543 as etchant (via sources 252 and 258, for example). Acid use tank 565 includes an empty sensor 571 and a low sensor 573. Acid dilution tank 549 includes an empty level sensor 575, a mid-level sensor 577, and a full sensor 579. Finally, concentrated acid measure tank 545 includes an empty level sensor 581 and a full level sensor 583. The functions of each of these level sensors will be described below with reference to FIG. 5B. Note that each of measure tank 545, dilution tank 549, and use tank 565 is outfitted with an overflow line which drains to overflow trap 563.

Both the acid use tank 565 and the hydrogen peroxide reservoir 543 contain a line to a dual syringe pump 585. This pump includes one syringe 587 for delivering sulfuric acid and a second syringe 589 for delivering hydrogen peroxide. Syringe pump 585 controls delivery of metered amounts of sulfuric acid and liquid etchant to a post electrofill module. While the invention is not limited to the use of a syringe pump, such pumps have certain advantages. They allow precise control of the correct amount of liquid to the post electrofill module. Further, they allow a backstroke which serves to pull back any undelivered liquid from the various nozzles within the post electrofill module. This prevents dripping which might have deleterious effects on the etching and cleaning processes. In addition, syringe pumps have the advantage that they are self-priming. Thus, they are ready to deliver fluid immediately.

Because the sulfuric acid is delivered to the post-electrofill module in two forms (undiluted and mixed with peroxide to form etchant), the acid syringe 587 delivers sulfuric acid to a three-way valve 591. One line from valve 591 directly exits the chemical dilution module 521 and is made available to the post electrofill module. Another line from valve 591 directs the sulfuric acid back to a mixing T joint 593. It is here that hydrogen peroxide from syringe 589 mixes with the sulfuric acid to form the liquid etchant. From T 593, liquid etchant travels to a three-way valve 595. One line from valve 595 delivers etchant to the top side of the wafer for edge bevel removal. The other outlet line from valve 595 delivers etchant to the backside etch nozzle of the post electrofill module.

By mixing the etchant components at in-line T 593, the etchant mixing occurs immediately before use. This has the benefit of providing a sub-saturated solution of gaseous oxygen in the liquid etchant. Note that hydrogen peroxide continually decomposes to liberate molecular oxygen. Eventually, such oxygen forms gas bubbles within the liquid. Bubbling nitrogen through the peroxide reservoir 543 helps remove some of this oxygen. Diluting the hydrogen peroxide with the sulfuric acid at T 593 immediately before delivery, further dilutes the concentration of molecular oxygen within the liquid etchant and reduces the likelihood that oxygen bubbles will appear in the etchant delivered to the post-electrofill module.

While only a single syringe pump is shown, a preferred embodiment employs three separate syringe pumps, one for each of three separate post electrofill modules. Note that in FIG. 1C, the system includes three separate electrofill modules and three separate post electrofill modules, all supplied by a single chemical dilution module. In the schematic illustration of chemical dilution module 521, the peroxide reservoir and the sulfuric acid use tank may each include one, two or three separate lines to syringe pumps that supply one, two or three separate post electrofill modules.

The reagent concentrations in the various tanks can be varied as appropriate. In one embodiment, the concentration of dilute sulfuric acid in the acid dilution and acid use tanks is between about 2.5 and 15% by weight, more preferably between about 5 and 10% by weight, and most preferably between about 6 and 8% by weight. Further, the concentration of hydrogen peroxide in the hydrogen peroxide reservoir is between about 5 and 30% by weight, more preferably between about 10 and 20% by weight, and most preferably between about 12 and 18% by weight.

Figure 5B:
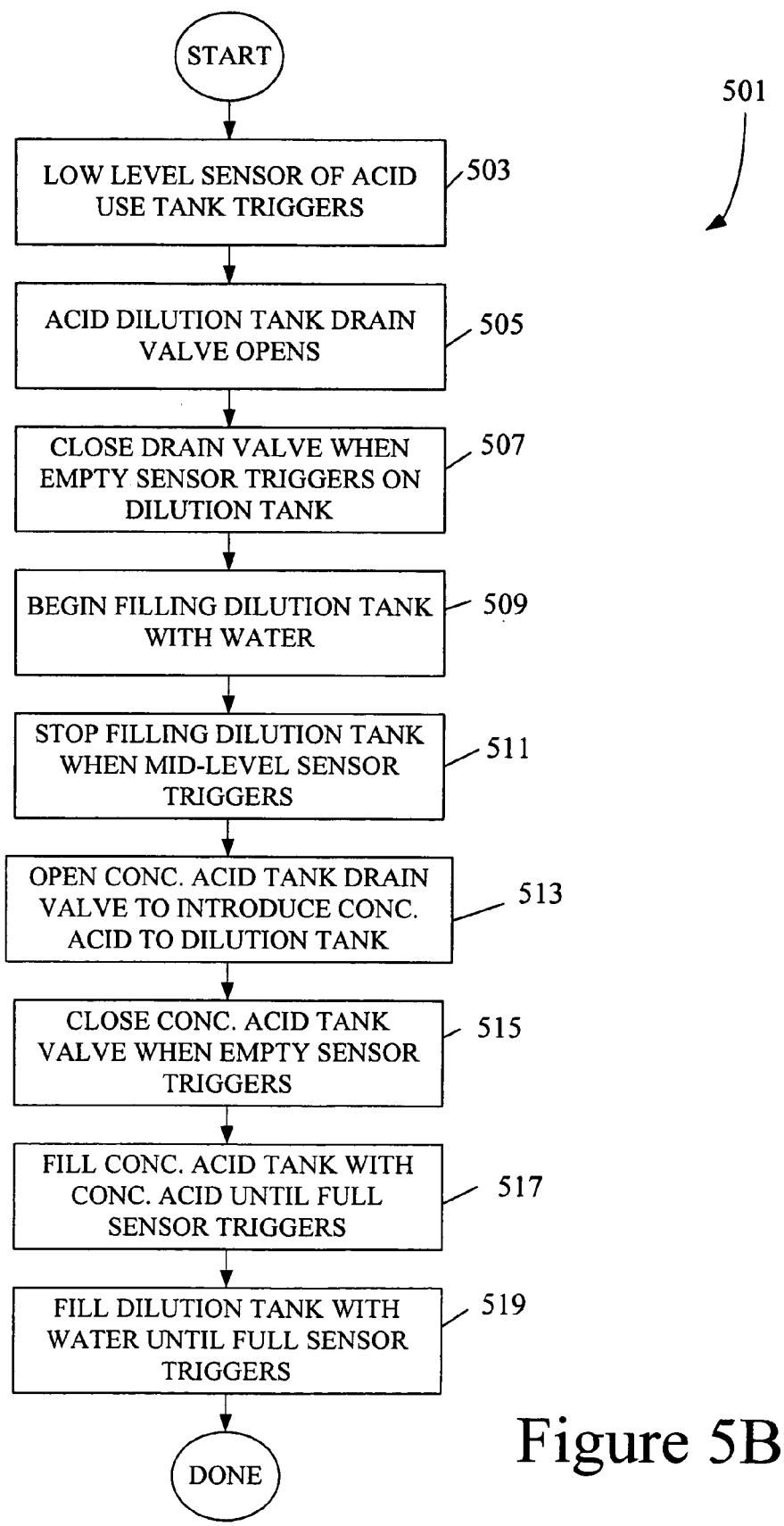
FIG. 5B is a process flow diagram depicting a sequence of operations employed to produce diluted acid for use in the post-electrofill module.

FIG. 5B is a process flow diagram depicting one suitable process 501 for preparing diluted sulfuric acid that may be employed in an etchant for a post electrofill module. Process 501 will be described with reference to some components of chemical dilution module 521 depicted in FIG. 5A. The inventive process is not limited to dilution modules necessarily having the same or similar components or arrangements of components.

Process 501 begins at 503 with low-level sensor 573 of acid use tank 565 indicating that the level of sulfuric acid in that tank has reached the level triggered by sensor 573. At this point, the module begins automatically filling use tank 565. Specifically, at 505, the module triggers opening of drain valve 569 to allow diluted sulfuric acid to flow from dilution tank 549 into use tank 565. Acid continues to flow into use tank 565 until the empty sensor 575 of dilution tank 549 triggers. This indicates that the level of acid in dilution tank 549 has dropped down to the level triggered by empty sensor 575. When this occurs, the module closes drain valve 569. See 507.

Next, the sulfuric acid in dilution tank 549 must be replenished. The module accomplishes this by first opening valve 535 to allow deionized water to flow into dilution tank 549. See 509. Deionized water continues to flow into tank 549 until mid-level sensor 577 indicates that its level has been reached. See 511. In a preferred embodiment, about 1 liter of deionized water is delivered to tank 549. At this point, valve 535 closes access to tank 549.

Next, at 513, the module opens drain valve 567 allowing the concentrated sulfuric acid from measure tank 545 to drain into dilution tank 549. In a preferred embodiment, about 75 milliliters of concentrated sulfuric acid is delivered. Regardless of the absolute quantities, concentrated sulfuric acid drains from tank 545 until the empty level sensor 581 triggers. At this point, the module closes drain valve 567. See 515.

Thereafter, the acid measure tank 545 is topped to the full level sensor 585 with concentrated sulfuric acid from source 527. See 517. Simultaneously, acid dilution tank 549 is topped with deionized water until its full level sensor 579 is reached. This facilitates mixing. In one embodiment, about an additional 1 liter of water is added. At this point the process is complete and remains quiescent until the diluted acid in use tank 565 needs to be replenished again.

This method has various advantages. All mixing is conducted in the dilution module 549 which is separate from use tank 565 and measure tank 545. With this arrangement, diluted acid is available at all times via use tank 565. The acid has been premixed and allowed to cool in separate dilution tank 549. Because the dilution process is highly exothermic, the freshly mixed acid is allowed to cool in dilution tank 549 prior to delivery to use tank 565. Note that the concentrated acid is added to a large volume of water in dilution tank 549 in order to control the highly exothermic reaction. Note also that nitrogen is bubbled through sulfuric acid in dilution tank 549. This facilitates mixing of the concentrated acid and the dionized water. It also deoxygenates the diluted sulfuric acid. This reduces the likelihood of oxygen bubbles forming in the liquid etchant.

Figure 5C:
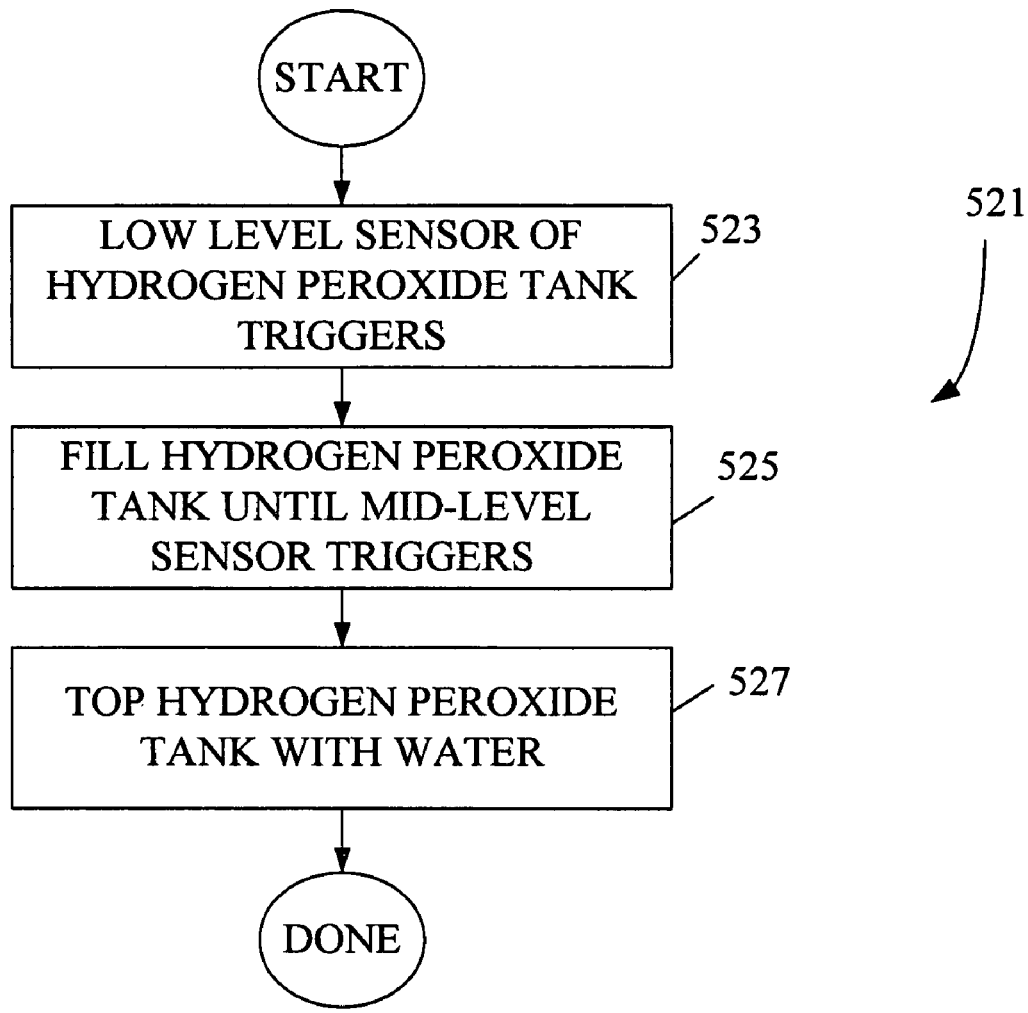
FIG. 5C is a process flow diagram depicting a sequence of operations employed to produce diluted hydrogen peroxide for use in the post-electrofill module.

FIG. 5C presents a process 521 for diluting hydrogen peroxide in accordance with one embodiment of this invention. Other suitable processes may be employed. Note that this discussion makes reference to chemical dilution module 521 and its associated components. The hydrogen peroxide dilution processes of this invention are not limited to module 521, the components contained therein, or the arrangement of components illustrated.

Process 521 begins at 523, with module 521 detecting a signal from low level sensor 551 of hydrogen peroxide reservoir 543. At this point, the module opens valve 531 to allow concentrated hydrogen peroxide to flow into reservoir 543. This process continues until the module receives a signal from mid-level sensor 553 of reservoir 543. At this point, the flow of concentrated hydrogen peroxide to the reservoir is stopped by closing valve 531. See 525. At this point, the module opens valve 537 to allow deionized water to flow into reservoir 543 until the full level sensor 553 signals that reservoir 543 is full. See 527. The process is then complete.

In cases where the use of the particular etchant chemical(s) are either an expense as a raw material or where the treatment of waste must be minimized, use of heated etchant can be useful. For example, etch rates of a 5% $H_2O_2$ and 5% $H_2SO_4$ can be increased approximately 2× for every 10 degrees C. in the range of 20 to 50 C. In line heating after the components have been mixed can enable increased etch rates with relatively low concentrations of chemical. Additionally, heating after mixing avoids the normally high rate of mixed etchant breakdown (lack of stability), when stored at an elevated temperature. In short, one aspect of the invention involves (1) storing the chemicals at ambient temperature (relatively cold), (2) mixing them cold, (3) heating them after they are mixed just prior to delivery, and then (4) applying them to the wafer to enable accelerated etch rate capability.

Another advantage of in line heating is a reduction in the amount of pre-rinsing thereby increasing throughput. It has been found that pre-rinsing is normally necessary to ensure that the EBR process produces a sharp (relatively vertical) boundary on the copper layer at the edge of the exclusion region (small taper width). It is believed that pre-rinse removes a built up layer of plating additives and other residues from the electroplating process. Use of hot etching solution appears to reduce or eliminate the need for pre-rinse while providing a sharp boundary on the copper layer. Additionally, the decrease in process time achieved with heated etchant minimizes the window for airborne or etchant related defects to impact the wafer surface. Further, it is anticipated that the increased speed of etching brought about by in-line heating will become increasingly important as technology moves toward reduced copper deposition thickness (e.g., 0.7 micrometer thick copper layers and below). Without some improvement in etching rate, the EBR process increasingly becomes a bottleneck.

In certain embodiments, heating the etchant is accomplished, at least partially, by using the heat of mixing of etchant components. Concentrated sulfuric acid, for example, releases a large amount of heat as it becomes hydrated. Thus, in certain embodiments, etchant heating is accomplished by mixing concentrated sulfuric acid with peroxide. In some cases, the mixing is performed in-line while the components are being delivered to the work piece for etching. Embodiments employing exothermic mixing have the advantage of eliminating or reducing the cost of buying apparatus for heating etchant. Additionally heating control over a non-continuous process is difficult, as different heating and possibly cooling rates must be utilized depending on whether the etchant is flowing or is stagnant.

Heating by use of the heat of mixing works with a wide array of etchant compositions. Essentially any composition that evolves heat upon mixing (and of course is effective for etching edge metal) can be employed. The sulfuric acid and hydrogen peroxide mixture will be used as an example. However, other etchants such as concentrated nitric acid, glacial acetic acid, perchloric acid, perbromic acid, and periodic acid also evolve heat on mixing and can be employed in certain etchant compositions of this invention.

In certain embodiments that employ in-line mixing of sulfuric acid and hydrogen peroxide or other oxidant, the sulfuric acid component is provided in a concentration of between about 40% and 100% by weight, or between about 70% and 98% by weight (e.g., 85% by weight). In certain embodiments, undiluted 98% by weight "stock" sulfuric acid may be employed. This has the advantage of eliminating the need for pre-processing or diluting the sulfuric acid prior to mixing with hydrogen peroxide. The hydrogen peroxide component may be provided in any concentration appropriate for the apparatus and etching conditions; e.g., between about 10 and 40% by weight (e.g., 31% by weight).

It has been found that certain volume ratios of concentrated sulfuric acid and hydrogen peroxide work well in ensuring a high etch rate. These include roughly 1:1 mixtures of concentrated hydrogen peroxide and concentrated sulfuric acid. More generally, ratios of between about 2:1 to 1:2 work well. At 98% weight sulfuric acid and 30% weight peroxide the solution reaches the boiling point of about 125° C. at a 1:1 ratio. The boiling point represents the maximum limit of the temperature and any further increase is due to the etching kinetics. Obviously, the optimal ratio depends on the concentrations of the component sulfuric acid and hydrogen peroxide.

The actual concentrations of the etchant components employed will vary depending on various factors such as the starting temperature of the components (typically though not necessarily room temperature), the desired final temperature of the delivered etchant solution (e.g., 40° C.), and the time between when the components are mixed and when they are delivered to the work piece surface. This last factor is a function of the flow rates of the etchants, the speed at which they are mixed after initial contact (which is in turn a function of flow conditions—turbulent, laminar, etc.), and the distance between where the components are mixed and where they are delivered to the work piece surface. In certain embodiments, the in-line mixing takes place in tubing only about 2 inches from the point of use.

Improved etch rates are obtained with etchant solutions at temperatures above room temperature. Preferably, the temperature of the delivered etchant is at least about 30° C., more preferably between about 40° C. and 130° C. The upper temperature bound is dictated by such factors and as what temperatures the mixing apparatus can withstand, the required ratio of etchant components (which determines how many calories/gram of solution will be generated), and the heat transfer characteristics of the delivery system. For many practical applications, the etchant temperature will not exceed 130° C.

Figure 6A:
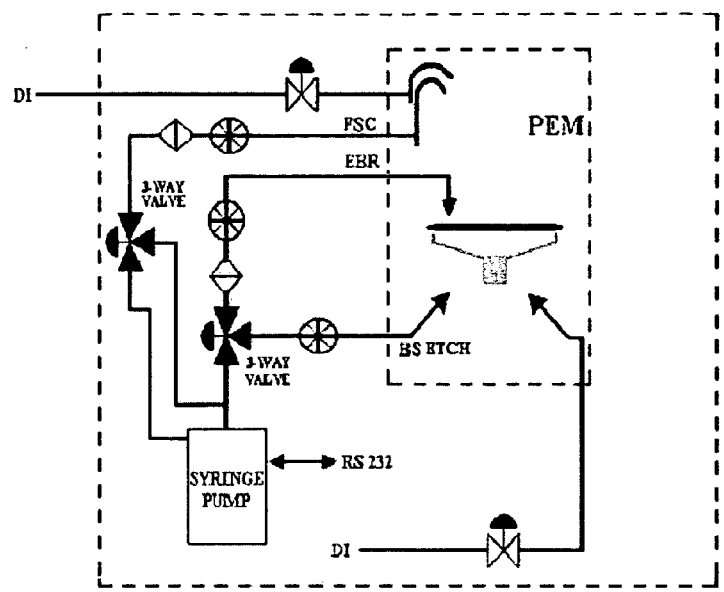
FIG. 6A is a schematic illustration of an in-line etchant mixing system.
Figure 6B:
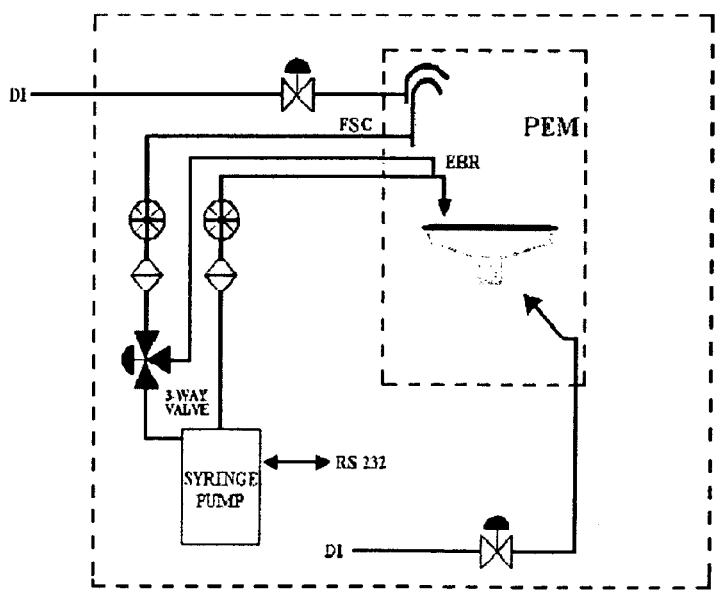
FIG. 6B is a schematic illustration of an in-line etchant mixing that delivers heated etchant by making use of exothermic mixing of the etchant components.

FIGS. 6A and 6B schematically depict mixing apparatus with and without provisions for in line heating and heated etchant delivery. FIG. 6A depicts a mixing and delivery system 601 in which etching and front side cleaning take place in a post-electrofill module (PEM 603) where a wafer 605 is provided on a platen or chuck 607. Front side cleaning is accomplished by delivery of acid deionized water through FSC nozzles 609. Edge bevel removal is accomplished by delivering unheated but mixed etchant (sulfuric acid and hydrogen peroxide) through a nozzle 611. Further back side etching is accomplished by delivering unheated but mixed etchant through a nozzle 613. Hydrogen peroxide and sulfuric acid are provided to system 601 via line 617 and 619, respectively. These are injected into the system via a syringe pump and mix with one another on a line 623. Some of the sulfuric acid is provided directly from syringe pump 621 to one port on a three-way valve 625 via a line 627.

Some of the mixed etchant is provided to a different port on three-way valve 625 via a line 629. Other portions of the mixed etchant are provided to a port on a different three-way valve 631 via line 623. One exit port on three-way valve 631 provides etchant to back side etch nozzle 613 and another exit port on valve 631 provides etchant to EBR nozzle 611.

Three-way valve 625 has separate entry ports for sulfuric acid and mixed etchant. It also has an exit port for delivering either of these solutions to one of the front side clean nozzles 609. The other front side clean nozzle 609 delivers deionized water from a line 635. A separate source of deionized water delivers water to the back side of the wafer via a line 637.

It is important to note that the mixing in this apparatus takes near the syringe pump 621, but far away from EBR nozzle 611. Hence, any heating of the etchant due to dilution of sulfuric acid is lost in transit to the wafer. In a typical case mixing takes place a few feet (e.g., 6 feet) behind the delivery nozzle.

FIG. 6B schematically depicts an in line heating system 650 for use with this invention. In some ways, it is similar to the embodiment depicted in FIG. 6A, but it employs mixing a line junction 653 very near to the EBR nozzle 611. In one embodiment, mixing occurs at a distance of about 1 to 5 inches (e.g., 2 inches) from the delivery nozzle 611. This allows etchant to be delivered to the wafer at an elevated temperature; e.g., about 130° C. Hence, higher etch rates can be achieved as described above.

In the depicted embodiment, concentrated sulfuric acid exits syringe pump 621 via a line 655 and enters a port of a three-way valve 657. The sulfuric acid can exit valve 657 via either of two ports, one to a line 659 for nozzles 609 and another to a line 661 for mixing junction 653. Hydrogen peroxide exits syringe pump 621 via a line 663, which connects to mixing junction 653. While not shown in this figure, plumbing for a back side etch may also be provided.

Figure 7A:
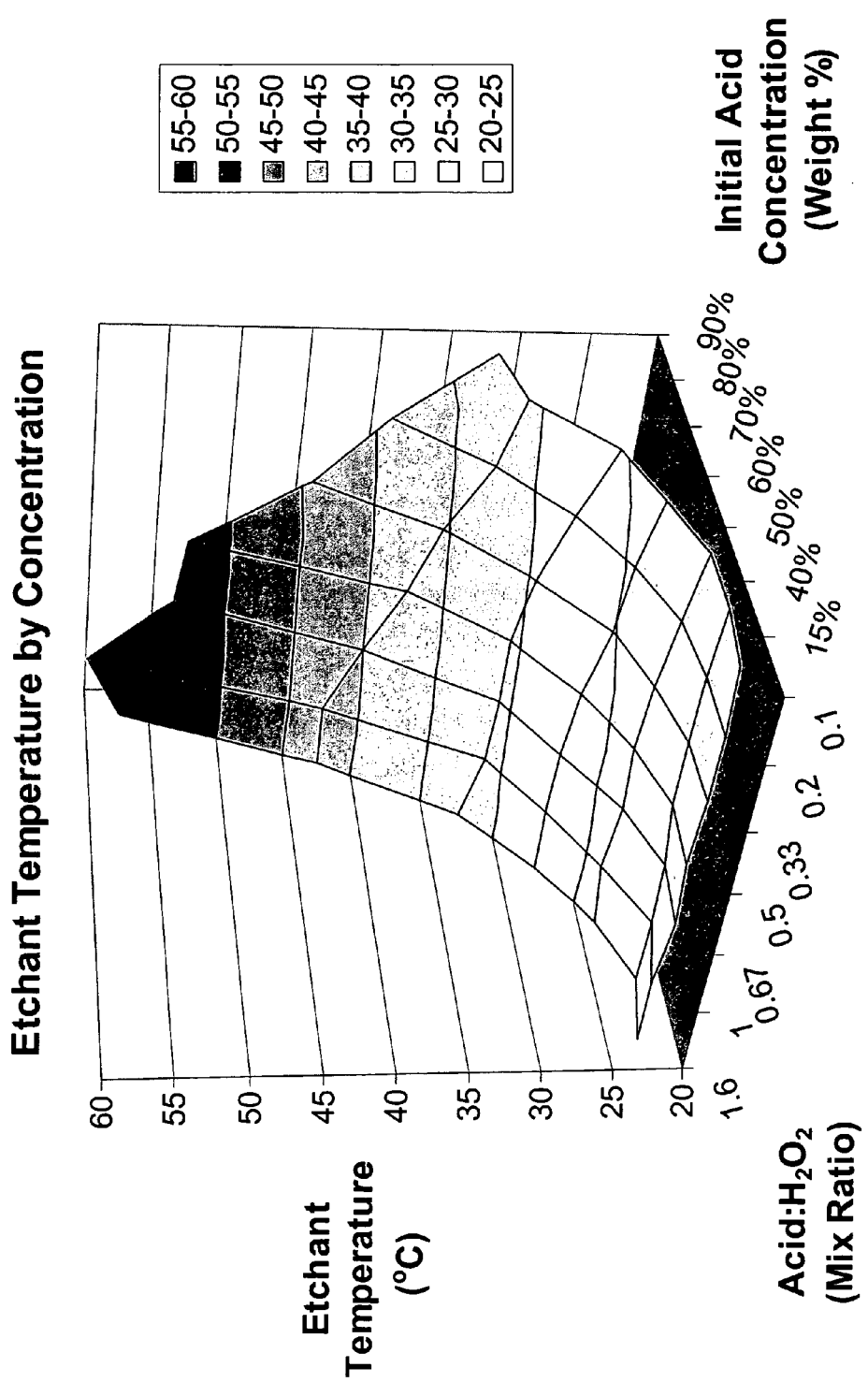
FIG. 7A is a three-dimensional plot showing how etchant temperature is affected by a starting concentration of concentrated sulfuric acid and a volume ratio of sulfuric acid and hydrogen peroxide.
Figure 7B:
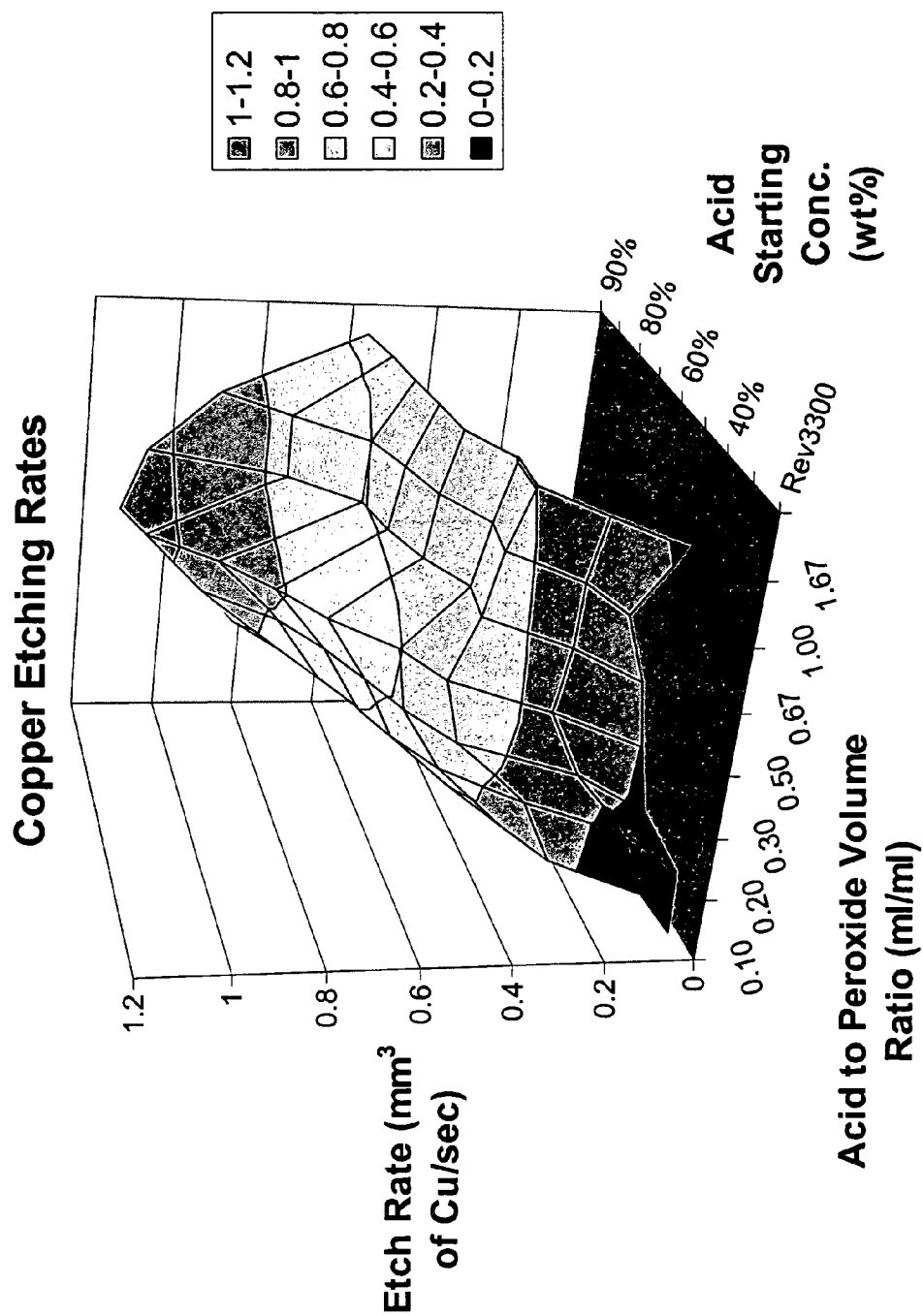
FIG. 7B is a three-dimensional plot showing how the rate of etching copper by heated etching solution is affected by a starting concentration of concentrated sulfuric acid and a volume ratio of sulfuric acid and hydrogen peroxide.

FIGS. 7A and 7B are three-dimensional plots showing etchant temperature (FIG. 7A) and copper etch rate (FIG. 7B) as a function of sulfuric acid concentration and acid:peroxide volume ratio (assuming 31% by weight hydrogen peroxide). As can be seen, higher starting concentrations of sulfuric acid generally lead to higher etchant temperatures and higher copper etch rates. Further, etch rates appear to be maximized by volume ratios of near 50:50 for 31% hydrogen peroxide and concentrated sulfuric acid.

While this invention has been described in terms of a few preferred embodiments, it should not be limited to the specifics presented above. Many variations on the above-described preferred embodiments may be employed. Note, for example, that other metal deposition processes (e.g., non-copper and/or non-PVD processes) frequently present the same problems as outlined above for the copper seed layer PVD process. In each case, unwanted metal must be removed after the deposition process. Further, unwanted metal may have to be removed from locations other than the edge of the semiconductor wafer. The present invention may be employed to etch unwanted metal in these cases. Therefore, the invention should be broadly interpreted with reference to the following claims.

What is claimed is:

1. A method of removing unwanted copper metal from an edge bevel area of a semiconductor wafer, the method comprising:

(a) providing a wafer having a layer of electrodeposited copper in the interior region of the wafer and a layer of PVD-deposited and/or electrodeposited copper in the edge bevel area;

(b) mixing components of a liquid etchant to form the liquid etchant, wherein the components comprise an acid and an oxidizer, and wherein the mixing takes place in delivery lines provided to deliver the liquid etchant from sources of the components to the wafer;

(c) generating heat by in-line mixing of the components, wherein the generated heat is used to raise the temperature of the liquid etchant to at least about 40° C.; and (d) delivering the warm liquid etchant onto the edge of the rotating wafer such that the warm liquid etchant selectively wets the edge bevel area and substantially removes unwanted copper metal selectively from the edge bevel area.

2. The method of claim 1, wherein the acid comprises sulfuric acid and the oxidizer comprises hydrogen peroxide.

3. The method of claim 2, wherein the sulfuric acid component is provided in concentration of at least about 40% by weight.

4. The method of claim 3, wherein the sulfuric acid component is provided in concentration of at least about 80% by weight.

5. The method of claim 2, wherein the sulfuric acid and hydrogen peroxide are provided in volume ratios of between about 30:70 and 70:30 for sulfuric acid and hydrogen peroxide.

6. The method of claim 1, wherein the liquid etchant flows over the edge bevel area for at least a portion of time during which the copper metal is removed from the edge bevel area.

7. The method of claim 6, wherein the liquid etchant flows continuously throughout the time during which the copper metal is removed from the edge bevel area.

8. The method of claim 1, wherein a flow of the liquid etchant is suspended during at least a portion of time during which the copper metal is removed from the edge bevel region, and thereafter rinsing said etchant from the edge bevel area.

9. The method of claim 8, wherein the flow of the liquid etchant is suspended for between about 1 and 60 seconds.

10. The method of claim 1 wherein the liquid etchant remains on the wafer for a period of time after application of the liquid etchant to the edge bevel area.

11. The method of claim 10, wherein the liquid etchant remains on the wafer for between about 2 and 30 seconds.

12. The method of claim 1, wherein the liquid etchant is delivered onto the edge of the rotating wafer without substantially contacting any region of the wafer inside of the edge bevel area.

13. The method of claim 1, wherein the liquid etchant is delivered from a pointed nozzle positioned proximate to the front edge of the rotating wafer.

14. The method of claim 13, wherein the pointed nozzle is positioned within 0.3 to 5 mm above the surface of the wafer, with an angular component in the direction of rotation of the wafer at between about 0-45° to the tangent of the wafer, and wherein the nozzle further has a radial component away from the center of the wafer and toward the edge of the wafer with the nozzle positioned at an angle of between about 30-70 degrees in a plane containing the normal to the wafer with respect to the normal to the wafer.

15. The method of claim 14, further comprising directing the liquid etchant at a backside of the semiconductor wafer to thereby etch unwanted metal that has deposited on the backside of the semiconductor wafer.

16. The method of claim 1, further comprising:
rinsing the liquid etchant from the semiconductor wafer after the unwanted metal has been removed from the edge bevel area;
directing the liquid etchant onto the backside of the semiconductor wafer to remove unwanted metal that has been deposited on the backside of the semiconductor wafer; and
drying the semiconductor wafer,
wherein rinsing the liquid etchant, performing a backside etch, and drying the wafer are all performed within a single processing module.

17. The method of claim 1, wherein the liquid etchant is delivered onto the rotating wafer.

18. The method of claim 1, further comprising: prior to the liquid etchant delivery, applying a prewetting liquid consisting essentially of water to the wafer, wherein the prewetting liquid wets at least the edge bevel region.

19. The method of claim 1, further comprising: prior to the liquid etchant delivery, applying a prewetting acidic aqueous solution to the wafer, wherein the prewetting acidic aqueous solution wets at least the edge bevel region of the wafer, and does not substantially remove copper metal.

20. The method of claim 1, wherein applying the warm liquid etchant comprises:
applying a first liquid etchant from a first delivery source directed to the front edge area of the semiconductor wafer, such that the first etchant is delivered only to within the outer 4 mm from the wafer edge on the front side of the wafer.

21. The method of claim 20, wherein applying the warm liquid etchant further comprises:
applying a second liquid etchant from a second delivery source directed to the back side of the semiconductor wafer to remove additional copper metal.

22. The method of claim 21, wherein the first and second liquid etchants have the same chemical composition.

23. The method of claim 21, wherein the second delivery source is a nozzle directed to the central portion of the wafer backside.

24. The method of claim 1, further comprising:
globally applying an isotropic copper etchant comprising a complexing agent and an oxidizer to remove at least some of the electrodeposited copper metal from the interior region of the wafer front side.

25. The method of claim 1, further comprising:
after the etching, applying an acidic cleaning solution to the wafer to remove copper oxide without substantially removing copper metal from the wafer.

26. The method of claim 25, further comprising rinsing the wafer to remove the acidic cleaning solution.

27. The method of claim 1, wherein the mixing of etchant components occurs at a distance of between about 1 and 5 inches from the delivery source distributing the etchant to the wafer.

28. The method of claim 1, wherein the semiconductor wafer is rotated at 200 to 500 rpm during applying of the warm liquid etchant.

29. The method of claim 1, wherein the warm liquid etchant is selectively delivered to the front edge area within about 4 mm from the wafer edge, and wherein said selectively delivered etchant further wets the side edge area of the semiconductor wafer and the back edge area of the semiconductor wafer.

30. A method of removing unwanted copper metal from an edge bevel area of a semiconductor wafer, the method comprising:

(a) providing a wafer having a layer of electrodeposited copper in the interior region of the wafer and a layer of PVD-deposited and/or electrodeposited copper in the edge bevel area;
(b) applying a prewetting liquid consisting essentially of water to the wafer, wherein the prewetting liquid wets at least the edge bevel region;
(c) delivering a liquid etchant comprising $H_2SO_4$ and $H_2O_2$ onto the pre-wetted edge of the wafer such that the liquid etchant selectively wets the edge bevel area and substantially removes unwanted copper metal selectively from the edge bevel area.

31. The method of claim 30, wherein the liquid etchant is selectively delivered to the front edge area within about 4 mm from the wafer edge.

32. The method of claim 30, wherein the sulfuric acid and hydrogen peroxide are mixed in the delivery lines.

33. The method of claim 30, wherein the etchant is delivered from a pointed nozzle positioned within 0.3 to 5 mm above the surface of the wafer front side, with an angular component in the direction of rotation of the wafer at between about 0-45° to the tangent of the wafer, and wherein the nozzle further has a radial component away from the center of the wafer and toward the edge of the wafer with the nozzle positioned at an angle of between about 30-70 degrees in a plane containing the normal to the wafer with respect to the normal to the wafer.

34. The method of claim 30, further comprising rotating the wafer while applying the liquid etchant.

35. The method of claim 30, wherein delivering the liquid etchant comprises:
applying a first liquid etchant from a first delivery source directed to the front edge area of the semiconductor wafer, such that the first etchant is selectively delivered to within the outer 4 mm from the wafer edge on the front side of the wafer without wetting the interior region of the front side of the wafer.

36. The method of claim 35, wherein delivering the liquid etchant further comprises:
applying a second liquid etchant from a second delivery source directed to the back side of the semiconductor wafer to remove additional copper metal.

37. The method of claim 30, wherein the first and second liquid etchants have the same chemical composition.

38. The method of claim 36, wherein the second delivery source is a nozzle directed to the central portion of the wafer backside.

39. The method of claim 30, further comprising:
globally applying an isotropic copper etchant comprising a complexing agent and an oxidizer to remove at least some of the electrodeposited copper metal from the interior region of the wafer front side.

40. The method of claim 30, further comprising:
after the etching, applying an acidic cleaning solution to the wafer to remove copper oxide without substantially removing copper metal from the wafer.

41. The method of claim 40, further comprising rinsing the wafer to remove the acidic cleaning solution.

42. A method of removing unwanted copper metal from an edge bevel area of a semiconductor wafer, the method comprising:
(a) providing a wafer having a layer of electrodeposited copper in the interior region of the wafer and a layer of PVD-deposited and/or electrodeposited copper in the edge bevel area;
(b) applying a first liquid copper etchant from a first delivery source directed to the front edge area of the semiconductor wafer, such that the first etchant does not reach the interior active circuit region of the semiconductor wafer and is confined to within the outer 4 mm from the wafer edge on the front side of the wafer, wherein the etchant further wets the side edge area of the semiconductor wafer and the back edge area of the semiconductor wafer; and (c) applying a second liquid copper etchant from a second delivery source directed to the back side of the semiconductor wafer to remove additional metal, wherein the second delivery source is directed to the central portion of the wafer back side, and wherein at least one of the first and the second liquid copper etchants comprises an acid and an oxidizer.

43. The method of claim 42, wherein the first and the second etchants have the same chemical composition.

44. The method of claim 42, wherein the delivery sources are pointed nozzles.

45. The method of claim 42, wherein the first liquid etchant is delivered from a pointed nozzle positioned within 0.3 to 5 mm above the surface of the wafer front side, with an angular component in the direction of rotation of the wafer at between about 0-45° to the tangent of the wafer, and wherein the nozzle further has a radial component away from the center of the wafer and toward the edge of the wafer with the nozzle positioned at an angle of between about 30-70 degrees in a plane containing the normal to the wafer with respect to the normal to the wafer.

46. The method of claim 42, further comprising rotating the wafer while applying the liquid etchant.

47. The method of claim 42, further comprising:
globally applying an isotropic copper etchant comprising a complexing agent and an oxidizer to remove at least some of the electrodeposited copper metal from the interior region of the wafer front side.

48. The method of claim 42, further comprising:
after the etching, applying an acidic cleaning solution to the wafer to remove copper oxide without substantially removing copper metal from the wafer.

49. The method of claim 42, further comprising rinsing the wafer to remove the acidic cleaning solution.

50. A method of removing unwanted copper metal from an edge bevel area of a semiconductor wafer, the method comprising:
(a) providing a wafer having a layer of electrodeposited copper in the interior region of the wafer and a layer of PVD-deposited and/or electrodeposited copper in the edge bevel area;
(b) globally applying an isotropic copper etchant comprising a complexing agent and an oxidant to remove at least some of the electrodeposited copper metal from the interior region of the wafer; and
(c) delivering a warm liquid copper etchant onto the edge of the wafer, such that the warm liquid etchant selectively wets the edge bevel area and substantially removes unwanted metal selectively from the edge bevel area, wherein forming the warm etchant used in (c) comprises mixing components of the liquid copper etchant in the delivery lines provided to deliver the liquid etchant from sources of the etchant components to the wafer, and wherein said mixing generates heat that is used to heat the etchant used in (c) to at least 40° C.

51. The method of claim 50, wherein the etchant used in (c) comprises an acid and an oxidizer.

52. The method of claim 50, wherein the etchant used in (c) comprises sulfuric acid and hydrogen peroxide.

53. The method of claim 50, wherein the etchant used in (c) is delivered from a pointed nozzle positioned within 0.3 to 5 mm above the surface of the wafer front side, with an angular component in the direction of rotation of the wafer at between about 0-45° to the tangent of the wafer, and wherein the nozzle further has a radial component away from the center of the wafer and toward the edge of the wafer with the nozzle positioned at an angle of between about 30-70 degrees in a plane containing the normal to the wafer with respect to the normal to the wafer.

54. The method of claim 50, wherein (c) comprises rotating the wafer while applying the liquid etchant.

55. The method of claim 50, wherein the mixing of etchant components in (c) occurs at a distance of between about 1 and 5 inches from the delivery source distributing the etchant to the wafer.

56. The method of claim 50, further comprising:
after the etching in (c), applying an acidic cleaning solution to the wafer to remove copper oxide without substantially removing copper metal from the wafer.

57. The method of claim 42, wherein (c) comprises selectively delivering the liquid etchant to a front edge area within the outer 4 mm of the wafer.

58. A method of removing unwanted copper metal from an edge bevel area of a semiconductor wafer, the method comprising:
(a) providing a wafer having a layer of electrodeposited copper in the interior region of the wafer and a layer of PVD-deposited and/or electrodeposited copper in the edge bevel area;
(b) applying a liquid copper etchant comprising an acid and an oxidizer from a delivery source that directs the liquid etchant to the front edge area of the semicondutor wafer, such that the etchant does not reach the interior active circuit region of the semiconductor wafer, wherein the etchant selectively removes copper metal from the edge bevel area;
(c) after copper etching, applying an acidic cleaning solution to remove copper oxide without substantially removing copper metal from the wafer; and
(d) rinsing the wafer to remove the acidic cleaning solution.

59. A method of removing unwanted copper metal from an edge bevel area of a semiconductor wafer, the method comprising:
(a) providing a wafer having a layer of electrodeposited copper in the interior region of the wafer and a layer of PVD-deposited and/or electrodeposited copper in the edge bevel area;
(b) rotating the wafer; and
(c) selectively removing copper from the edge region within the outer 4 mm of the wafer front side edge without removing copper from the interior region of the wafer by delivering a liquid copper etchant from a pointed nozzle positioned within 0.3 to 5 mm above the surface of the wafer front side, with an angular component in the direction of rotation of the wafer at between about 0-45° to the tangent of the wafer, wherein the nozzle further has a radial component away from the center of the wafer and toward the edge of the wafer with the nozzle positioned at an angle of between about 30-70 degrees in a plane containing the normal to the wafer with respect to the normal to the wafer.

* * * * *